US012624452B2

(12) United States Patent
Fessler et al.

(10) Patent No.: US 12,624,452 B2
(45) Date of Patent: May 12, 2026

(54) SYSTEMS AND METHODS OF CONTROLLING GAS FLOWS IN SEMICONDUCTOR PROCESSING SYSTEMS

(71) Applicant: ASM IP Holding B.V., Almere (NL)

(72) Inventors: Mark Fessler, Phoenix, AZ (US); Glenn Holbrook, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 594 days.

(21) Appl. No.: 17/750,875

(22) Filed: May 23, 2022

(65) Prior Publication Data

US 2022/0380900 A1     Dec. 1, 2022

Related U.S. Application Data

(60) Provisional application No. 63/193,372, filed on May 26, 2021.

(51) Int. Cl.
*C23C 16/40* (2006.01)
*C23C 16/44* (2006.01)
*C23C 16/455* (2006.01)

(52) U.S. Cl.
CPC .... *C23C 16/45587* (2013.01); *C23C 16/4412* (2013.01)

(58) Field of Classification Search
CPC .......... C23C 16/45587; C23C 16/4412; C23C 16/45561; C23C 16/4408; C23C 16/455; C23C 16/45512; C23C 16/52; C23C 16/448; C23C 16/45557; H01J 37/3244; H01J 37/32449; H01L 21/67017; H01L 21/67253

USPC ........................ 118/715; 156/345.33, 345.34
See application file for complete search history.

(56) References Cited

U.S. PATENT DOCUMENTS

| | | | |
|---|---|---|---|
| 5,394,755 A | 3/1995 | Sudo et al. | |
| 5,672,832 A * | 9/1997 | Cucci | G01F 1/44 |
| | | | 73/861.47 |
| 5,735,961 A | 4/1998 | Shimada | |
| 5,997,588 A | 12/1999 | Goodwin | |
| 6,425,281 B1 | 7/2002 | Sheriff et al. | |
| 6,497,252 B1 * | 12/2002 | Kohler | B01F 33/3011 |
| | | | 137/833 |
| 6,752,166 B2 * | 6/2004 | Lull | G05D 7/0664 |
| | | | 137/9 |
| 7,481,240 B2 * | 1/2009 | Nagaoka | H01L 21/67017 |
| | | | 137/486 |

(Continued)

FOREIGN PATENT DOCUMENTS

| | | |
|---|---|---|
| JP | H0955369 A | 2/1997 |
| JP | H11287691 A | 10/1999 |

*Primary Examiner* — Rudy Zervigon
(74) *Attorney, Agent, or Firm* — Snell & Wilmer L.L.P.

(57) ABSTRACT

A gas system includes an enclosure, a process gas metering valve, a shutoff valve, and a flow switch. The process gas metering valve arranged within the enclosure to flow a process gas to a process chamber of a semiconductor processing system. The shutoff valve is connected to the process gas metering valve to fluidly separate the process gas metering valve from a process gas source. The flow switch is operably connected to the shutoff valve to cease flow of the process gas to the process chamber of the semiconductor processing system using the shutoff valve according to flow of a gas traversing the flow switch. Semiconductor processing systems, gas control methods, and gas system kits are also described.

17 Claims, 12 Drawing Sheets

(56)             References Cited

U.S. PATENT DOCUMENTS

| | | | |
|---|---|---|---|
| 7,621,290 B2* | 11/2009 | Ding | G05D 7/0664 |
| | | | 137/9 |
| 7,673,645 B2* | 3/2010 | Ding | G05D 11/132 |
| | | | 137/870 |
| 8,123,860 B2 | 2/2012 | Thakur | |
| 8,373,117 B2 | 2/2013 | Badiei | |
| 9,856,580 B2 | 1/2018 | Sanchez | |
| 10,168,049 B2 | 1/2019 | Amikura et al. | |
| 10,774,422 B2 | 9/2020 | Winkler | |
| 11,866,825 B2 | 1/2024 | Hayashi et al. | |
| 2003/0226588 A1* | 12/2003 | Olander | F17C 13/04 |
| | | | 137/240 |
| 2004/0050325 A1* | 3/2004 | Samoilov | C23C 16/45561 |
| | | | 156/345.33 |
| 2004/0050326 A1 | 3/2004 | Thilderkvist et al. | |
| 2004/0118342 A1* | 6/2004 | Cheng | C23C 16/455 |
| | | | 118/715 |
| 2005/0029369 A1* | 2/2005 | Nagaoka | H01L 21/67017 |
| | | | 239/548 |
| 2005/0031495 A1 | 2/2005 | Choi | |
| 2006/0188645 A1* | 8/2006 | Forti | B05C 5/001 |
| | | | 118/684 |
| 2006/0191478 A1 | 8/2006 | Gondhalekar et al. | |
| 2007/0181192 A1 | 8/2007 | Choi | |
| 2008/0006650 A1 | 1/2008 | Tseng | |
| 2008/0085226 A1 | 4/2008 | Fondurulia | |
| 2016/0215392 A1 | 7/2016 | Yudovsky et al. | |
| 2017/0168036 A1* | 6/2017 | Albright | G01N 33/0073 |
| 2019/0368041 A1* | 12/2019 | Sreeram | C23C 16/45557 |
| 2020/0294820 A1* | 9/2020 | Shimizu | G05D 21/02 |

* cited by examiner

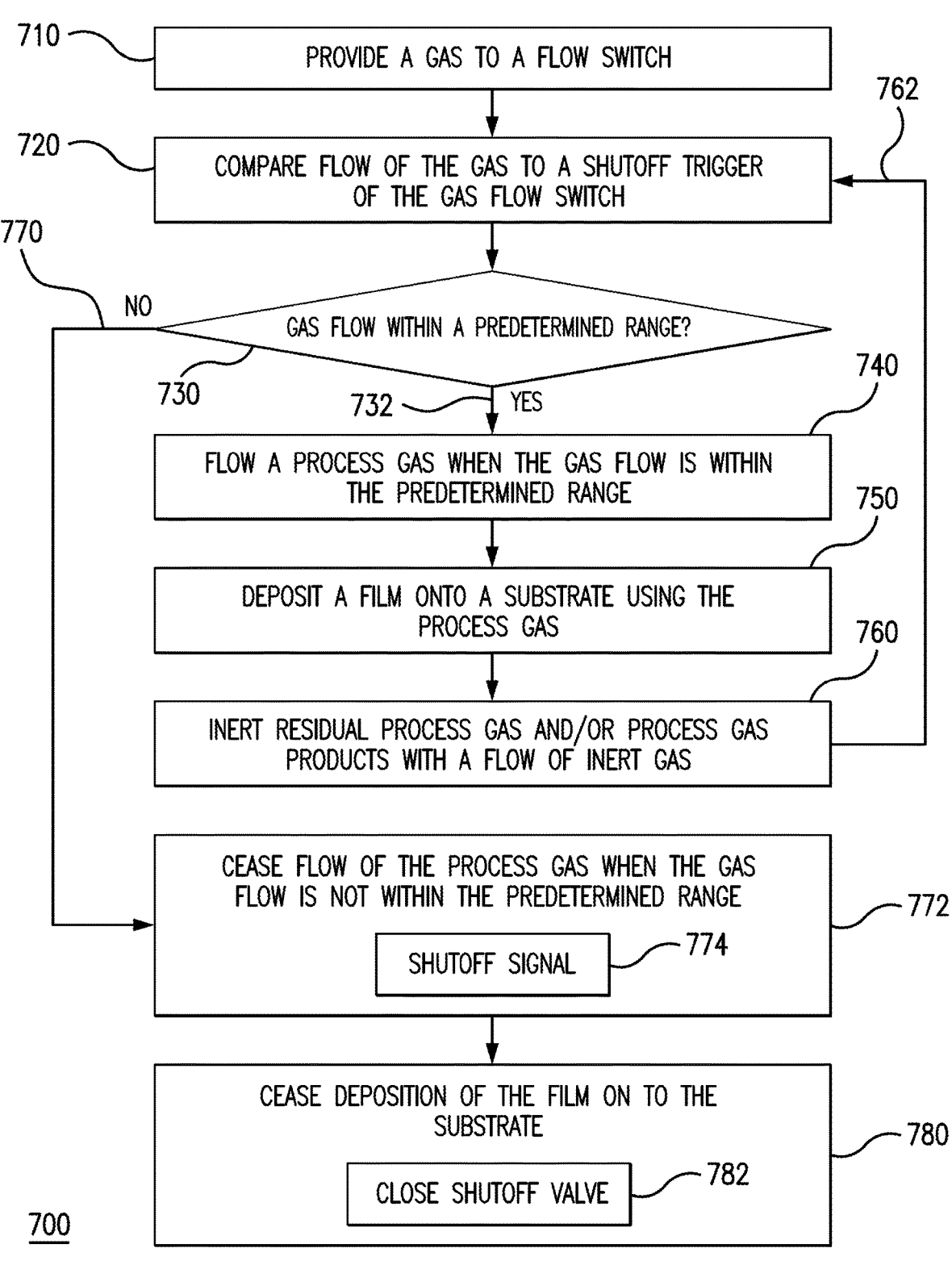

710 — PROVIDE A GAS TO A FLOW SWITCH

762

720 — COMPARE FLOW OF THE GAS TO A SHUTOFF TRIGGER OF THE GAS FLOW SWITCH

770

NO — GAS FLOW WITHIN A PREDETERMINED RANGE?

730    732 — YES    740

FLOW A PROCESS GAS WHEN THE GAS FLOW IS WITHIN THE PREDETERMINED RANGE

750

DEPOSIT A FILM ONTO A SUBSTRATE USING THE PROCESS GAS

760

INERT RESIDUAL PROCESS GAS AND/OR PROCESS GAS PRODUCTS WITH A FLOW OF INERT GAS

CEASE FLOW OF THE PROCESS GAS WHEN THE GAS FLOW IS NOT WITHIN THE PREDETERMINED RANGE

SHUTOFF SIGNAL — 774

772

CEASE DEPOSITION OF THE FILM ON TO THE SUBSTRATE

CLOSE SHUTOFF VALVE — 782

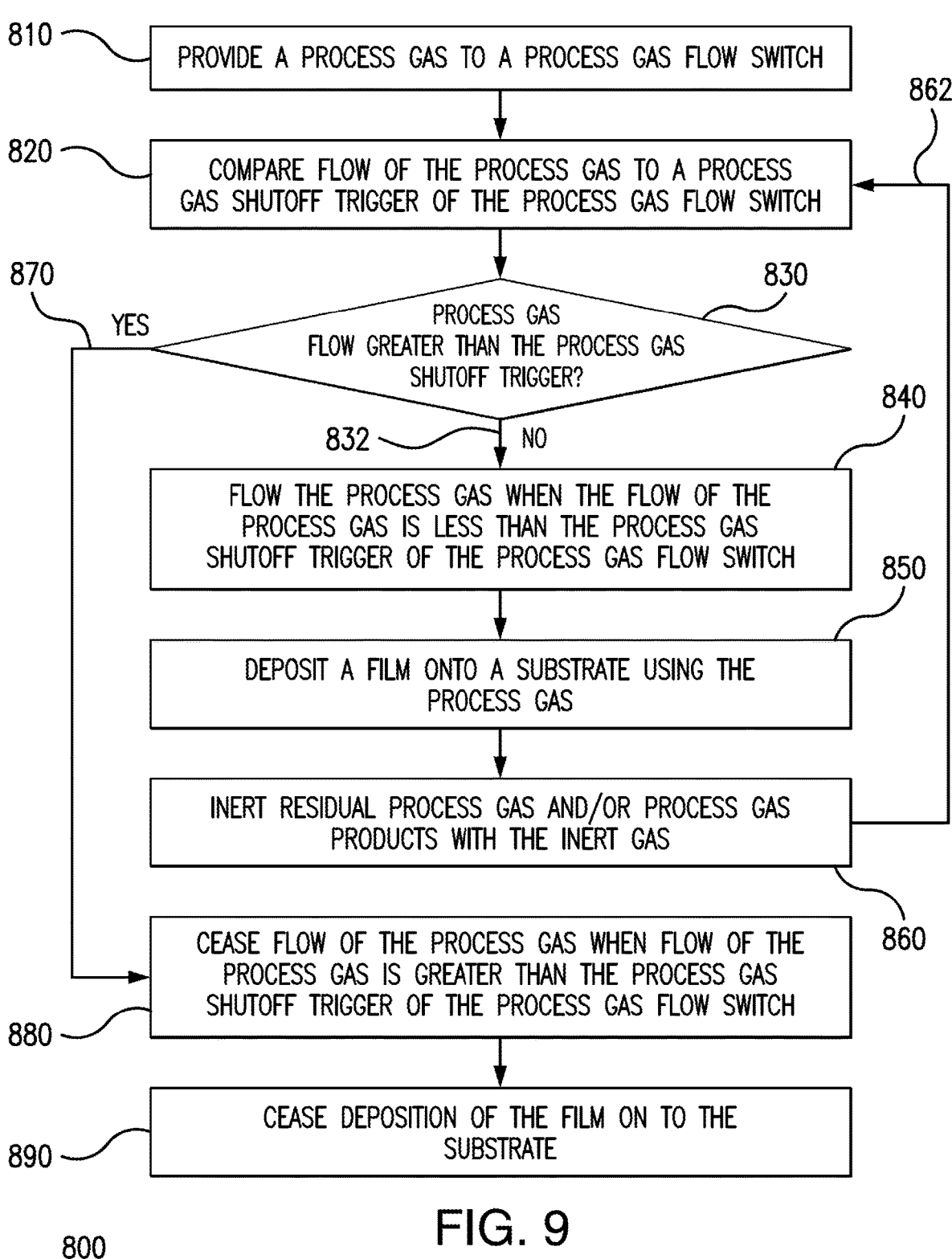

810 — PROVIDE A PROCESS GAS TO A PROCESS GAS FLOW SWITCH

862

820 — COMPARE FLOW OF THE PROCESS GAS TO A PROCESS GAS SHUTOFF TRIGGER OF THE PROCESS GAS FLOW SWITCH

870    YES    830    PROCESS GAS FLOW GREATER THAN THE PROCESS GAS SHUTOFF TRIGGER?

832    NO    840

FLOW THE PROCESS GAS WHEN THE FLOW OF THE PROCESS GAS IS LESS THAN THE PROCESS GAS SHUTOFF TRIGGER OF THE PROCESS GAS FLOW SWITCH

850

DEPOSIT A FILM ONTO A SUBSTRATE USING THE PROCESS GAS

INERT RESIDUAL PROCESS GAS AND/OR PROCESS GAS PRODUCTS WITH THE INERT GAS

860

CEASE FLOW OF THE PROCESS GAS WHEN FLOW OF THE PROCESS GAS IS GREATER THAN THE PROCESS GAS SHUTOFF TRIGGER OF THE PROCESS GAS FLOW SWITCH

880

890 — CEASE DEPOSITION OF THE FILM ON TO THE SUBSTRATE

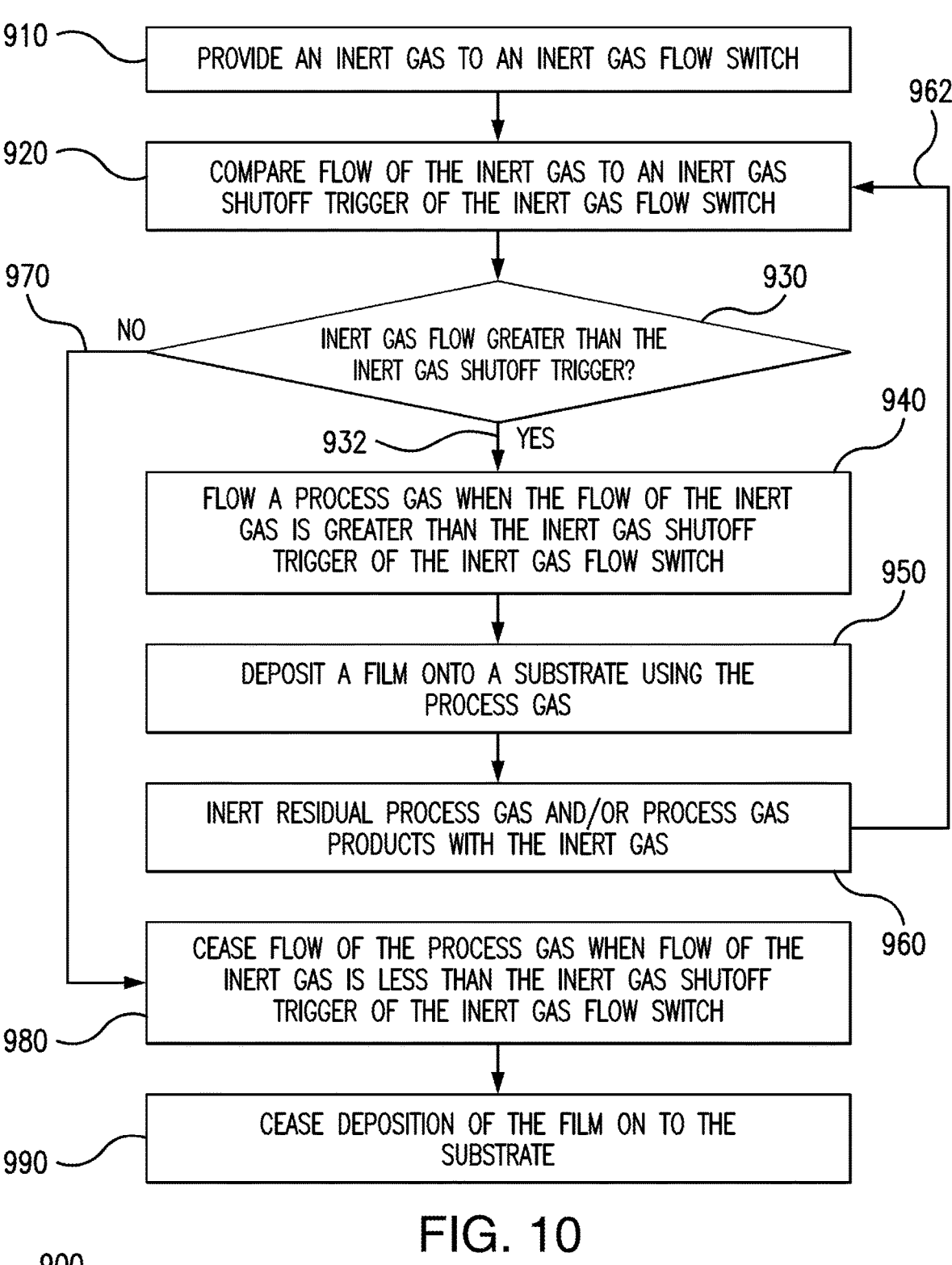

910 — PROVIDE AN INERT GAS TO AN INERT GAS FLOW SWITCH

962

920 — COMPARE FLOW OF THE INERT GAS TO AN INERT GAS SHUTOFF TRIGGER OF THE INERT GAS FLOW SWITCH

970

930 — INERT GAS FLOW GREATER THAN THE INERT GAS SHUTOFF TRIGGER?

NO

932 — YES

940 — FLOW A PROCESS GAS WHEN THE FLOW OF THE INERT GAS IS GREATER THAN THE INERT GAS SHUTOFF TRIGGER OF THE INERT GAS FLOW SWITCH

950 — DEPOSIT A FILM ONTO A SUBSTRATE USING THE PROCESS GAS

960 — INERT RESIDUAL PROCESS GAS AND/OR PROCESS GAS PRODUCTS WITH THE INERT GAS

980 — CEASE FLOW OF THE PROCESS GAS WHEN FLOW OF THE INERT GAS IS LESS THAN THE INERT GAS SHUTOFF TRIGGER OF THE INERT GAS FLOW SWITCH

990 — CEASE DEPOSITION OF THE FILM ON TO THE SUBSTRATE

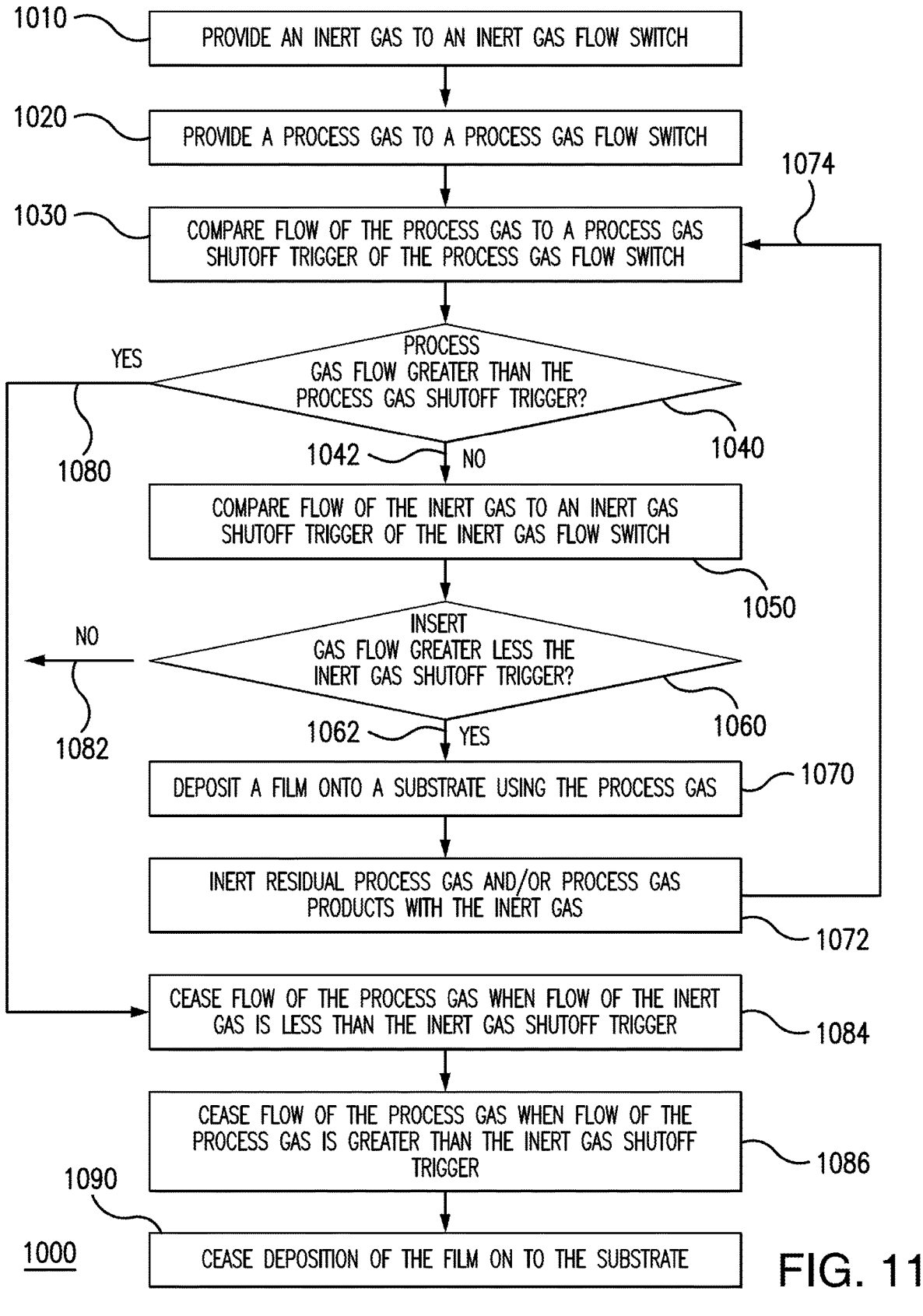

1010 — PROVIDE AN INERT GAS TO AN INERT GAS FLOW SWITCH

1020 — PROVIDE A PROCESS GAS TO A PROCESS GAS FLOW SWITCH

1030 — COMPARE FLOW OF THE PROCESS GAS TO A PROCESS GAS SHUTOFF TRIGGER OF THE PROCESS GAS FLOW SWITCH

1074

PROCESS GAS FLOW GREATER THAN THE PROCESS GAS SHUTOFF TRIGGER?

YES    1080    1042    NO    1040

COMPARE FLOW OF THE INERT GAS TO AN INERT GAS SHUTOFF TRIGGER OF THE INERT GAS FLOW SWITCH

1050

INSERT GAS FLOW GREATER LESS THE INERT GAS SHUTOFF TRIGGER?

NO    1082    1062    YES    1060

DEPOSIT A FILM ONTO A SUBSTRATE USING THE PROCESS GAS — 1070

INERT RESIDUAL PROCESS GAS AND/OR PROCESS GAS PRODUCTS WITH THE INERT GAS — 1072

CEASE FLOW OF THE PROCESS GAS WHEN FLOW OF THE INERT GAS IS LESS THAN THE INERT GAS SHUTOFF TRIGGER — 1084

CEASE FLOW OF THE PROCESS GAS WHEN FLOW OF THE PROCESS GAS IS GREATER THAN THE INERT GAS SHUTOFF TRIGGER — 1086

1090

1000    CEASE DEPOSITION OF THE FILM ON TO THE SUBSTRATE

FIG. 11

SYSTEMS AND METHODS OF CONTROLLING GAS FLOWS IN SEMICONDUCTOR PROCESSING SYSTEMS

CROSS-REFERENCE TO RELATED APPLICATIONS

This application claims the benefit of U.S. Provisional Application No. 63/193,372, filed on May 26, 2021, in the United States Patent and Trademark Office, the disclosure of which is incorporated herein in its entirety by reference.

FIELD OF INVENTION

The present disclosure generally relates to controlling gas flows in semiconductor processing systems, and more particularly to controlling hazardous process gas flows in semiconductor processing systems.

BACKGROUND OF THE DISCLOSURE

Process tools used to fabricate semiconductor devices employ process gases to perform various process operations during the fabrication of semiconductor devices, such as to deposit films onto substrates during the fabrication of very large-scale integration circuit devices, solar cells, and displays. The process gases generally flow from a process gas source to the process tool through a metering device, which regulates flow of process gas according to the processing requirements of the process tool employing the process gas. During processing, the process tool typically issues an exhaust flow, which may include residual process gas and/or various process gas products. Since residual process gas and/or various process gas products may be hazardous, e.g., flammable and/or toxic, inert gases may be intermixed with the residual process gas products and/or process gas products to limit (or eliminate) potential hazards otherwise associated with the residual process gas and/or process gas products exhausted by the process tool.

One challenge to intermixing inert gases into exhaust flows is the cost associated with certain inert gases. For example, to ensure that concentration of potentially hazardous compounds in the exhaust flow is sufficiently low, flow (e.g., mass flow or volumetric flow) of the inert gas provided to the process tool may be sized in view of the largest flow rate of process gas provided to the process tool, such as in the event that the process gas supply valve is inadvertently driven to a fully open position. While generally satisfactory insofar that the flow rate of inert gas is sufficient to reduce hazards associated with relatively high flow rates of residual process gas and/or process gas products, the strategy also means that the inert gas flow rate is routinely greater than that required by the process employed by the process tool. This increases operating costs of the process tool due to inert gas consumption. It also requires that certain process tool accessories, such as ventilation systems and/or exhaust abatement systems, be larger than otherwise possible.

One approach to limiting cost associated with inert gas is to employ a flow restrictor or flow rate governor into the process gas supply line. Flow restrictors and flow rate governors may be employed to limit process gas flows to process tools from the source side (e.g., from the house or bulk supply of a process gas) when sized to be smaller than the flow rating of the process gas valve and larger than the process flow required by the process tool. However, while effective in limiting the inert gas requirements of the process tool, flow restrictors and flow rate governors are typically also oversized with respect to the process gas flow required by the process tool. Accordingly, the flow rate of inert gas provided to the process tool is still higher than otherwise required by the process tool, operating costs of the process tool due to inert gas requirements being higher than otherwise required.

Such systems and methods have generally been acceptable for their intended purpose. However, there remains a need for improved gas systems, semiconductor processing systems with gas system, and methods of controlling process gas flows in semiconductor processing systems. The present disclosure provides a solution to this need.

SUMMARY OF THE DISCLOSURE

A gas system is provided. The gas system includes an enclosure, a process gas metering valve, a shutoff valve, and a flow switch. The process gas metering valve is arranged within the enclosure and is configured to flow a process gas to a process chamber of a semiconductor processing system. The shutoff valve is connected to the process gas metering valve and is configured to fluidly separate the process gas metering valve from a process gas source. The flow switch is operably connected to the shutoff valve and configured to cease flow of the process gas to the process chamber of the semiconductor processing system using the shutoff valve according to flow of a gas traversing the flow switch.

In addition to one or more of the features described above, or as an alternative, further examples may include that at least one of the shutoff valve and the flow switch are arranged outside of the enclosure.

In addition to one or more of the features described above, or as an alternative, further examples may include that the flow switch is fluidly coupled to the shutoff valve and the process gas metering valve.

In addition to one or more of the features described above, or as an alternative, further examples may include that the flow switch is fluidly isolated from the shutoff valve.

In addition to one or more of the features described above, or as an alternative, further examples may include that the flow switch has a shutoff trigger, that the process gas metering valve has a flow rating, and that the shutoff trigger of the flow switch is smaller than the flow rating of the process gas metering valve.

In addition to one or more of the features described above, or as an alternative, further examples may include a relay connecting the flow switch to the shutoff valve.

In addition to one or more of the features described above, or as an alternative, further examples may include a controller connecting the flow switch to the shutoff valve.

In addition to one or more of the features described above, or as an alternative, further examples may include that the flow switch is a process gas flow switch connected to the shutoff valve, and that the gas system further includes a process gas source connected to process gas flow switch and a process chamber connected to the process gas metering valve. The process gas flow switch may fluidly couple the process gas source to the process chamber.

In addition to one or more of the features described above, or as an alternative, further examples may include that the process gas source comprises a silicon-containing gas.

In addition to one or more of the features described above, or as an alternative, further examples may include that the process gas source is a first process gas source, that the process gas flow switch is a first process gas flow switch, and that the shutoff valve is a first shutoff valve. The gas system may further include a second process gas source, a second process gas flow switch connected to the second process gas source, and a second shutoff valve connected to the second process gas flow switch. The second shutoff valve may fluidly couple the second process gas source to the process chamber. The second process gas flow switch may be operably connected to the second shutoff valve.

In addition to one or more of the features described above, or as an alternative, further examples may include a foreline, a vacuum pump, an inert gas flow switch, and an inert gas source. The foreline may be connected to the process chamber, the vacuum pump may be connected to the foreline, and the inert gas flow switch may be connected to the vacuum pump. The inert gas source may be connected to the inert gas flow switch and fluidly coupled therethrough to the vacuum pump, and the inert gas flow switch may be operably connected to the shutoff valve.

In addition to one or more of the features described above, or as an alternative, further examples may include that the flow switch is an inert gas flow switch and that the gas system further includes a process gas source connected to shutoff valve, a process chamber connected to the process gas metering valve and fluidly coupled therethrough to the process gas source, a vacuum pump connected to the process chamber, and an inert gas source connected to the inert gas flow switch and fluidly coupled therethrough to the vacuum pump.

In addition to one or more of the features described above, or as an alternative, further examples may include that the inert gas flow switch has an inert gas shutoff trigger and is configured to close the shutoff valve when flow of the inert gas traversing the inert gas flow switch and to the vacuum pump is less than the inert gas shutoff trigger In addition to one or more of the features described above, or as an alternative, further examples may include that the flow switch is a process gas flow switch and that the gas system further includes a foreline fluidly coupled to the process gas metering valve, a vacuum pump connected to the foreline, and an inert gas flow switch fluidly coupled to the vacuum pump and therethrough to the foreline. The inert gas switch may be operably connected to the shutoff valve.

In addition to one or more of the features described above, or as an alternative, further examples may include that the inert gas flow switch has an inert gas shutoff trigger and that the inert gas flow switch is configured to close the shutoff valve when flow of the inert gas traversing the inert gas flow switch is less than the inert gas shutoff trigger.

In addition to one or more of the features described above, or as an alternative, further examples may include that the inert gas flow switch is a first inert gas flow switch, and that the gas system further includes an exhaust conduit and a second inert gas flow switch. The exhaust conduit may be connected to the vacuum pump. The second inert gas flow switch fluidly may be coupled to the exhaust conduit and therethrough to the vacuum pump. The second inert gas flow switch may be operably connected to the flow switch.

A semiconductor processing system is provided. The semiconductor processing system includes a gas system as described above, a process gas source, a process chamber, and a substrate support. The process gas source is connected to the process gas flow switch. The process chamber is fluidly coupled to the flow switch by the process gas metering valve and the shutoff valve. The substrate support is arranged within the process chamber and is configured to seat thereon a substrate during deposition of a film onto the substrate using a process gas provided by the process gas source. The flow switch is a process gas flow switch having a process gas shutoff trigger, the process gas metering valve has a flow rating, and the process gas shutoff trigger of the process gas flow switch is smaller than the flow rating of the process gas metering valve.

A gas flow control method is provided. The method includes, at a gas system as described above, providing a process gas to the flow switch, comparing flow of the process gas to a shutoff trigger of the flow switch, and flowing the process gas through the shutoff valve to the process gas metering valve and therethrough to a process chamber of a semiconductor processing system when the flow of the process gas is less than a shutoff trigger of the flow switch. Flow of the process gas through the shutoff valve and therethrough to the process chamber of the semiconductor processing system ceases when flow of the process gas is greater than the shutoff trigger of the flow switch.

In addition to one or more of the features described above, or as an alternative, further examples may include that flowing the process gas through the shutoff valve further includes depositing a film onto a substrate using the process gas.

In addition to one or more of the features described above, or as an alternative, further examples may include that ceasing flow of the process gas comprises ceasing deposition the film onto the substrate.

Another gas control method is provided. The gas control method includes, at a gas system as described above, providing an inert gas to the flow switch, comparing flow of the inert gas to a shutoff trigger of the flow switch, and flowing a process gas through the shutoff valve to the process gas metering valve and therethrough to a process chamber of a semiconductor processing system when the flow of the inert gas is greater than the shutoff trigger of the flow switch. Flow of the process gas through the shutoff valve and therethrough to the process chamber of the semiconductor processing system ceases when flow of the inert gas is less than the shutoff trigger of the flow switch.

In addition to one or more of the features described above, or as an alternative, further examples may include that the flow switch is an inert gas flow switch, that the gas system further includes a process gas flow switch, and that the method further includes providing a process gas to the process gas flow switch, comparing flow of the process gas to a process gas shutoff trigger of the process gas flow switch, and flowing the process gas through the shutoff valve to the process gas metering valve when the flow of the process gas is less than the process gas shutoff trigger of the process gas flow switch. Flow of the process gas through the shutoff valve ceases when flow of the process gas is greater than the process gas shutoff trigger of the process gas flow switch.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING
FIGURES

These and other features, aspects, and advantages of the invention disclosed herein are described below with reference to the drawings of certain embodiments, which are intended to illustrate and not to limit the invention.

FIG. 8 is a block diagram of a method of controlling gas flow in a semiconductor processing system, showing operations for ceasing flow of a process gas to a process chamber using a gas flow traversing a flow switch;

FIG. 9 is a block diagram of another method of controlling gas flow in a semiconductor processing system, showing operations for ceasing flow of a process gas to a process chamber using flow of a process gas traversing a process gas flow switch;

FIG. 10 is a block diagram of a further method of controlling gas flow in a semiconductor processing system, showing operations for ceasing flow of a process gas to a process chamber using flow of an inert gas traversing an inert gas flow switch;

FIG. 11 is a block diagram of yet another method of controlling gas flow in a semiconductor processing system, showing operations for ceasing flow of a process gas to a process chamber using flows of a process gas and an inert gas traversing a process gas flow switch and an inert gas flow switch.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Figure 1:
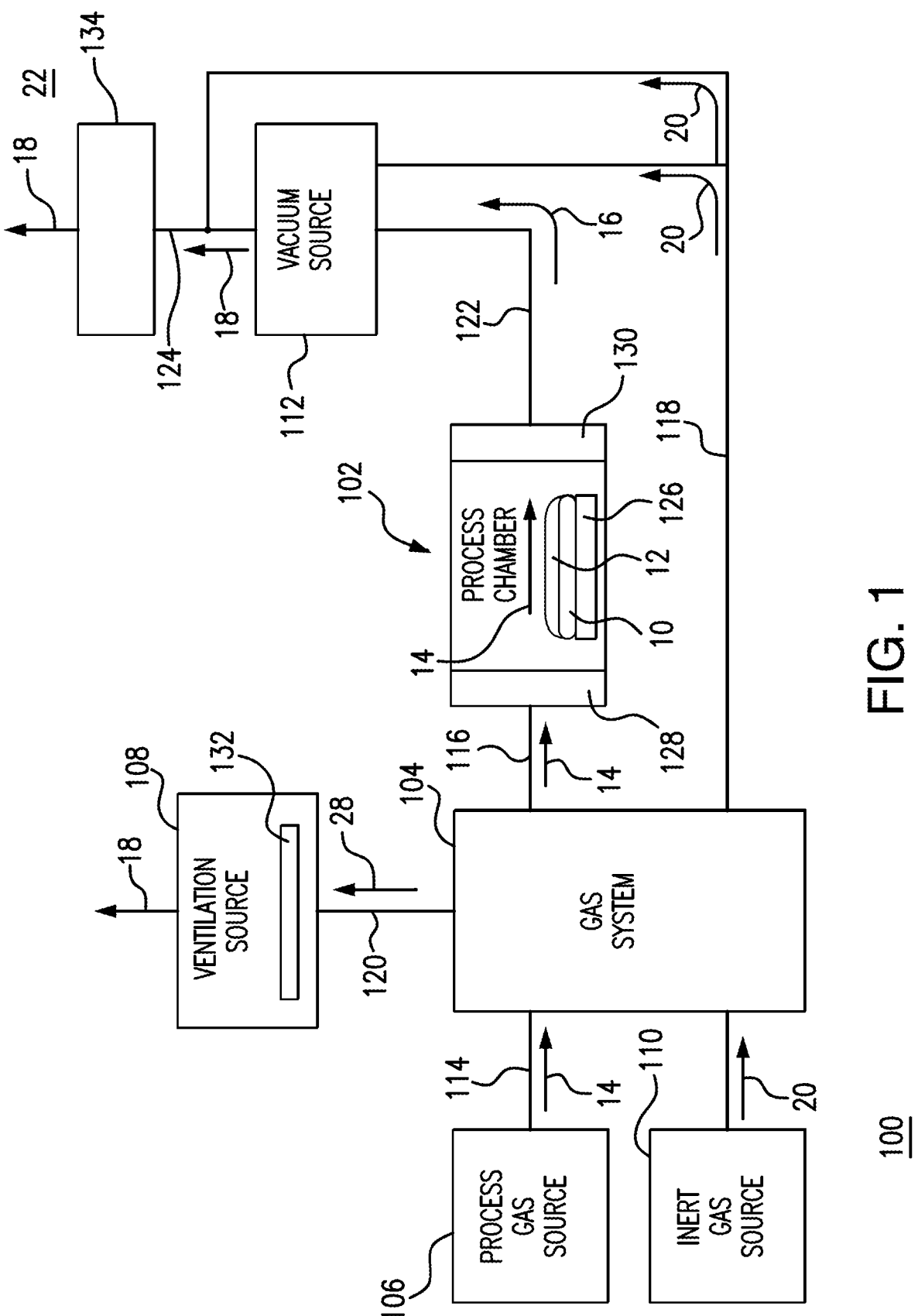
FIG. 1 is a schematic view of a semiconductor processing system in accordance with the present disclosure, showing a gas system fluidly coupling a process gas source and an inert gas source to a process chamber.

Reference will now be made to the drawings wherein like reference numerals identify similar structural features or aspects of the subject disclosure. For purposes of explanation and illustration, and not limitation, a partial view of an example of a semiconductor processing system with a gas system in accordance with the present disclosure is shown in FIG. 1 and is designated generally by reference character 100. Other examples of gas systems, semiconductor processing systems, and methods of controlling gas flows in semiconductor processing systems in accordance with the present disclosure, or aspects thereof, are provided in FIGS. 2-12, as will be described. The systems and methods of the present disclosure can be used to limit mass flow of inert gas required by semiconductor processing systems and/or to enhance safety of semiconductor processing systems, such as semiconductor processing system employing potentially hazardous process gases during the deposition of films onto substrates, though the present disclosure in not limited to any particular type of semiconductor processing system or process gas in general.

Referring to FIG. 1, the semiconductor processing system 100 is shown according to an example. As shown in FIG. 1, the semiconductor processing system 100 includes a process chamber 102 and a gas system 104. The semiconductor processing system 100 also includes a process gas source 106, an inert gas source 110, a ventilation source 108, and a vacuum source 112. The semiconductor processing system 100 further includes a process gas source conduit 114, a process gas supply conduit 116, an inert gas conduit 118, a ventilation conduit 120, a foreline 122, and an exhaust conduit 124.

The process chamber 102 includes a substrate support 126, an injection flange 128, and an exhaust flange 130. The substrate support 126 is arranged within the interior of the process chamber 102 and is configured to support a substrate 10 during the deposition of a film 12 onto the substrate 10 using a process gas 14. The injection flange 128 is connected to the process gas source conduit 114 and is fluidly coupled to the interior of the process chamber 102 to flow the process gas 14 through the interior of the process chamber 102. The exhaust flange 130 is connected to the foreline 122 and is fluidly coupled to the interior of the process chamber 102 to flow residual process gas and/or process gas products 16 to the foreline 122. The process chamber 102 may be as shown and described in U.S. Pat. No. 10,167,557 to Hawkins et al., issued on Jan. 1, 2019, the contents of which are incorporated herein by reference in its entirety.

The gas system 104 is connected to the process gas source conduit 114 and is fluidly coupled therethrough to the process chamber 102. The gas system 104 is also connected to the process gas source conduit 114 and is fluidly coupled therethrough to the process gas source 106. The gas system 104 is further to the ventilation conduit 120 and is fluidly coupled therethrough to ventilation source 108. In certain examples, the gas system 104 may be arranged along the inert gas conduit 118 and fluidly coupled therethrough to both the inert gas source 110 and the vacuum source 112.

The process gas source 106 is connected to the process gas source conduit 114 and is fluidly coupled therethrough to the process chamber 102. It is contemplated that the process gas source 106 be configured to provide the process gas 14 to the process chamber 102 through the process gas source conduit 114 and the process gas supply conduit 116. In certain examples, the process gas source 106 may include a silicon-containing gas. Examples of suitable silicon-containing gases include silane ($SiH_4$), dichlorosilane (DCS), and trichlorosilane (TCS). In accordance with certain examples, the process gas source 106 may include a halide-containing gas. Examples of suitable halides include chlorine (Cl), fluorine (F), and hydrochloric acid (HCl). It is also contemplated that, in accordance with certain examples, the process gas source 106 may include a germanium-containing gas or a dopant-containing gas. Examples of suitable germanium-containing gases include germane (GeH₄). Examples of suitable dopants include boron (B), arsenic (Ar), and phosphorus (Ph).

The ventilation source 108 is connected to the ventilation conduit 120 and is fluidly coupled therethrough to the gas system 104. It is contemplated that the ventilation source 108 be fluidly separated from the process chamber 102 and configured to provide ventilation to one or more process gas-conveying structures of the gas system 104. In certain examples, the ventilation source 108 may have include blower or fan 132. The blower or fan 132 may be arranged to draw a vent gas 28 through the gas system 104. The blower or fan 132 may also be arranged to drive the vent gas 28 through the gas system 104, as suitable for the arrangement of the semiconductor processing system 100.

The inert gas source 110 is connected to the inert gas conduit 118 and is fluidly coupled therethrough to the vacuum source 112. In certain examples, the inert gas source 110 may be fluidly coupled to the vacuum source 112 by the gas system 104. In accordance with certain examples, the inert gas source 110 may be fluidly separated from the gas system 104. It is contemplated that the inert gas source 110 include an inert gas 20. In certain examples, the inert gas 20 may include nitrogen (N₂), such as high-purity nitrogen (HPN). In accordance with certain examples, the inert gas 20 may include a noble gas. Examples of suitable noble gases also include argon (Ar), helium (He), krypton (Kr), and mixtures thereof.

The vacuum source 112 is connected to the foreline 122 and is fluidly coupled therethrough to the process chamber 102. The vacuum source 112 is also connected to the inert gas conduit 118 and is fluidly coupled therethrough to the inert gas source 110. The vacuum source 112 is further connected to the exhaust conduit 124 and is fluidly coupled therethrough to the external environment 22. In certain examples, the vacuum source 112 may be fluidly coupled to the external environment 22 through an abatement device 134, such as a scrubber and/or a nitrogen oxide abatement device. In accordance with certain examples, the exhaust conduit 124 may also be connected to the inert gas conduit 118 such that the inert gas source 110 is connected to both the vacuum source 112 and the exhaust conduit 124. It is contemplated that, in accordance with certain examples, the vacuum source 112 may include a vacuum source 112 configured to maintain a predetermined deposition pressure within the process chamber 102 during deposition of the film 12 onto the substrate 10.

During deposition of the film 12 onto the substrate 10, the substrate 10 is supported within the process chamber 102 and on the substrate support 126, the inert gas source 110 provides the inert gas 20 to the vacuum source 112, and the process gas source 106 provides the process gas 14 to the process chamber 102. The process chamber 102 flows the process gas 14 across the substrate 10 at predetermined flow rate, e.g., a mass or volumetric flow rate, selected to deposit the film 12 onto the substrate 10 and thereafter issues residual process gas and/or process gas products 16 to the foreline 122. The foreline 122 flows the residual process gas and/or process gas products 16 to the vacuum source 112, which intermixes the inert gas 20 received from the inert gas source 110 with the residual process gas and/or process gas products 16 to form an exhaust gas 18. In this respect the inert gas 20 limits (or eliminates) hazards associated with the residual process gas and/or process gas products 16, e.g., by reducing toxicity and/or concentration to below that required for combustion, rendering the residual process gas and/or process gas products 16 safe for communication to the exhaust conduit 124. As will be appreciated by those of skill in the art in view of the present disclosure, the flow rate of the inert gas 20 required to render the residual process gas and/or process gas products 16 safe is selected in view of the greatest flow rate of the process gas 14 provided to the process chamber 102 possible. Typically, the flow rate of the inert gas 20 corresponds to a flow rating 136 (shown in FIG. 2) of a process gas metering valve 138 (shown in FIG. 2) and/or an aperture plate 140 (shown in FIG. 2) arranged along the process gas source conduit 114, and not the smaller flow rate of the process gas 14 ordinary provided to the process chamber 102 during deposition of the film 12 onto the substrate 10, to ensure that exhaust gas 18 is rendered safe in the unlikely event that process gas metering valve 138 is moved to (or becomes fixed in) a full-open position. As will also be appreciated by those of skill in the art in view of the present disclosure, this generally means that the flow rate of the inert gas 20 to the vacuum source 112 is larger than that required by the process chamber 102 during the deposition of the film 12 onto the substrate 10. As will also be appreciated by those of skill in the art, this makes operating costs of the semiconductor processing system 100 higher than otherwise necessary and/or cause certain elements of the semiconductor processing system 100 such as the ventilation source 108 and/or the abatement device 134 larger than otherwise required. To limit such operating costs of the semiconductor processing system 100 and/or enhance safety of the semiconductor processing system 100, the gas system 104 includes a flow switch 142.

Figure 2:
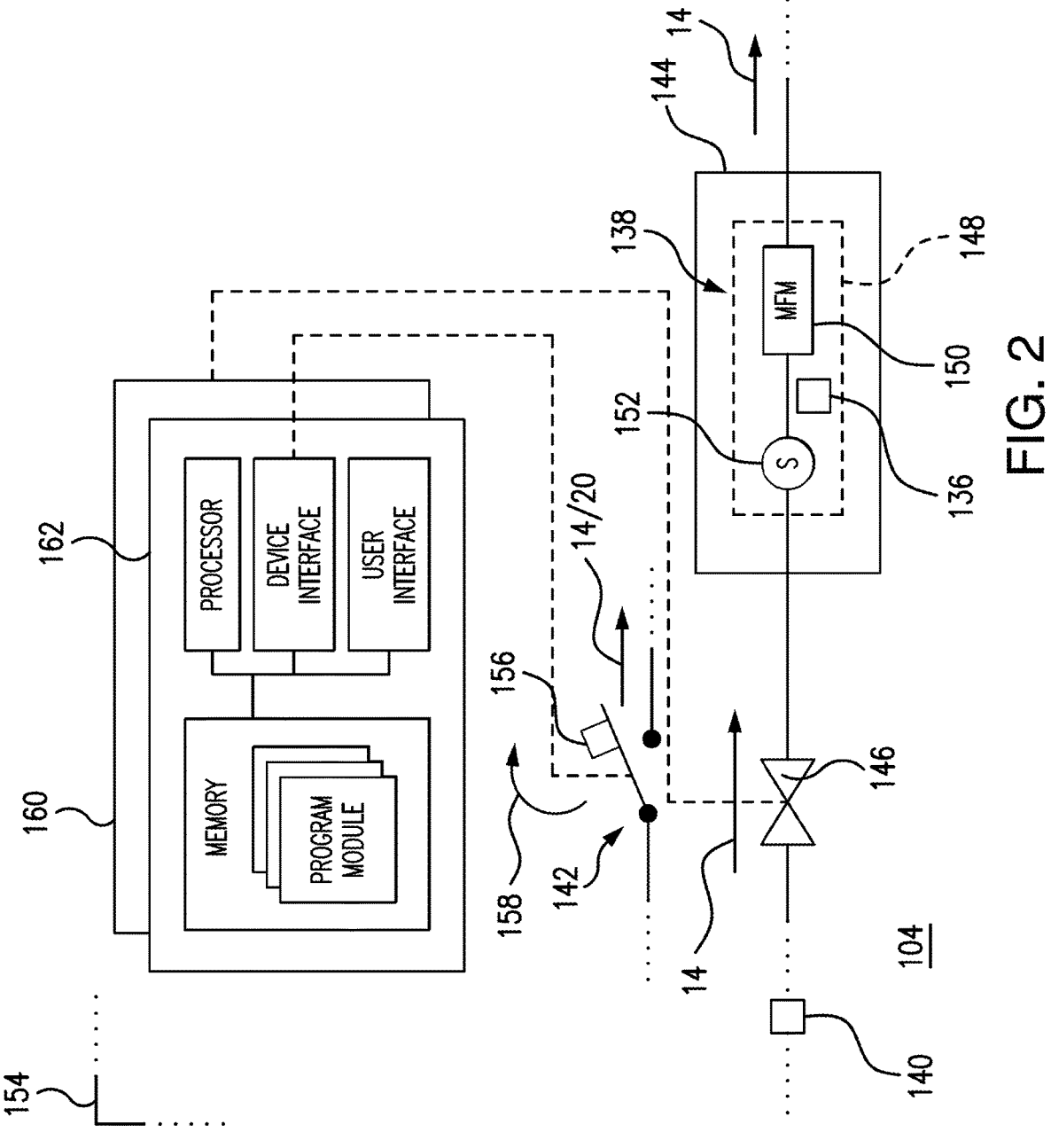
FIG. 2 is a schematic view of the gas system of FIG. 1, showing a flow switch of the gas system operatively connected to a shutoff valve of the gas system to cease flow of a process gas to the process chamber according to flow of a gas traversing the flow switch.

With reference to FIG. 2, the gas system 104 is shown. The gas system 104 includes the process gas metering valve 138, the flow switch 142, an enclosure 144, and a shutoff valve 146. The process gas metering valve 138 is arranged within the enclosure 144 and is configured to flow the process gas 14 to the process chamber 102 (shown in FIG. 1) of the semiconductor processing system 100 (shown in FIG. 1). The shutoff valve 146 is connected to the process gas metering valve 138 and is configured to fluidly separate the process gas metering valve 138 from the process gas source 106 (shown in FIG. 1). The flow switch 142 is operably connected to the shutoff valve 146 and is configured to cease flow of the process gas 14 to the process chamber 102 of the semiconductor processing system 100 using the shutoff valve 146 according to flow of a gas, e.g., the process gas 14 or the inert gas 20 (shown in FIG. 1), traversing the flow switch 142.

In certain examples, the enclosure 144 may be connected to the ventilation conduit 120 (shown in FIG. 1) such that an interior of the enclosure 144 is fluidly coupled to the ventilation source 108. As will be appreciated by those of skill in the art in view of the present disclosure, fluid coupling to the ventilation source 108 allows the ventilation source 108 to ventilate gas-conveying structures arranged within the interior of the enclosure 144, e.g., the process gas metering valve 138. In this respect the ventilation source 108 may drive (or draw) the vent gas 28 (shown in FIG. 1) through the interior of the enclosure 144. In certain examples, the enclosure 144 may include a gas cabinet structure. Examples of suitable gas cabinet structures include FirstNano® gas cabinets, available from the CVD Equipment Corporation of Central Islip, New York.

The process gas metering valve 138 is connected to the process gas supply conduit 116 and fluidly couples the process chamber 102 (shown in FIG. 1) to the process gas source 106 (shown in FIG. 1). In certain examples, the flow rating 136 of the process gas metering valve 138 corresponds to the largest flow rate (e.g., mass or volumetric flow rate) of the process gas 14 that the process gas metering valve 138 may flow to the process chamber 102. It is contemplated that the flow rating 136 of the process gas metering valve 138 be larger than a nominal deposition flow rate of the process gas 14 required for the deposition of the film 12 (shown in FIG. 1) onto the substrate 10 (shown in FIG. 1). For example, the flow rating 136 may be between 2 and 5 times the nominal deposition flow rate, or between 1.5 and 10 times the nominal deposition flow rate, or even between 1.25 and 20 times the nominal deposition flow rate of the process employed to deposit the film 12 onto the substrate 10.

In certain examples, the process gas metering valve 138 may include a mass flow controller (MFC) 148. In such examples, the MFC 148 may include a mass flow meter (MFM) 150 and a servo-controlled valve 152. The servo-controlled valve 152 may fluidly couple the MFM 150 to the process gas supply conduit 116 and be arranged to vary mass flow of the process gas 14 (shown in FIG. 1) to the process chamber 102 (shown in FIG. 1). The MFM 150 in turn may fluidly couple the servo-controlled valve 152 to the process chamber 102 to monitor flow rate of the process gas 14 to the process chamber 102, compare the flow rate to a predetermined deposition flow rate, and drive the flow rate of the process gas 14 to the predetermined deposition flow rate during deposition of the film 12 (substrate 10) onto the substrate 10 (shown in FIG. 1). Examples of suitable MFC devices include FMA-LP2600A MFC devices, available from Omega Engineering, Inc. of Norwalk, Connecticut. Examples of suitable MFM devices include FMC-5501LA MFM devices, available from Omega Engineering, Inc. of Norwalk, Connecticut. Although a particular arrangement of the process gas metering valve 138 is shown in FIG. 2 it is to be understood and appreciated that other types of process gas metering valves may be employed, e.g., manual valves and differently-actuated valves, and remain within the scope of the present disclosure.

The shutoff valve 146 is configured to provide selective fluid communication between the process gas source 106 (shown in FIG. 1) and the process gas metering valve 138. In this respect the shutoff valve 146 may be connected to the process gas source conduit 114 and fluidly coupled therethrough to the process gas source 106. In further respect, it is contemplated that shutoff valve 146 have a normally-open arrangement, the shutoff valve 146 thereby fluidly coupling the process gas source 106 to the process gas metering valve 138. In certain examples, the shutoff valve 146 may be arranged within the enclosure 144. In accordance with certain examples, the shutoff valve 146 may be arranged outside of the enclosure 144. It is also contemplated that, in accordance with certain examples, the shutoff valve 146 may be arranged in a housing 154, e.g., a facilities housing, to kit the shutoff valve 146 with the flow switch 142 according to the deposition process employed by the process chamber 102 (shown in FIG. 1). Examples of suitable shutoff valves include 930 Series ultra-high purity valves, available from the Parker-Hannifin Corporation of Cleveland, Ohio.

The flow switch 142 is fluidly coupled to a gas source to control flow of the process gas 14 to the process chamber 102 (shown in FIG. 1) according to the flow rate of gas through the flow switch 142. In this respect it is contemplated that the flow switch 142 have a shutoff trigger 156, that the flow switch 142 be configured to compare the flow rate of a gas traversing the flow switch 142 to the shutoff trigger 156, and that the flow switch 142 further be configured to provide a shutoff signal 158 based on the comparison of a flow rate (e.g., mass or volumetric flow rate) of the gas traversing the flow switch 142 to the shutoff trigger 156. It is further contemplated that operative association of the flow switch 142 with the shutoff valve 146 be such that the shutoff valve 146 closes when the flow switch 142 provides the shutoff signal 158. Examples of suitable flow switches include V8F Series flow switches, available from the Precision Sensors Corporation of Milford, Connecticut.

In certain examples, the flow switch 142 may be fluidly coupled to the process gas source 106 (shown in FIG. 1) and configured to provide the shutoff trigger 156 when flow of the process gas 14 traversing the flow switch 142 is greater than the shutoff trigger 156. In accordance with certain examples, the shutoff trigger 156 may be smaller than the flow rating 136 of the process gas metering valve 138. Advantageously, examples of the gas system 104 where the shutoff trigger 156 of the flow switch 142 is smaller than the flow rating 136 of the process gas metering valve 138 may limit the flow rate of the inert gas 20 required by the semiconductor processing system 100, commensurate limiting cost associated with operation of the semiconductor processing system 100. Limiting the flow rate of the inert gas 20 required by the semiconductor processing system 100 may also reduce cost of the semiconductor processing system 100, for example, by limiting required ventilation and/or abatement, limiting costs associated with the ventilation source 108 (shown in FIG. 1) and/or the abatement device 134 (shown in FIG. 1). In accordance with certain examples, the flow switch 142 may be fluidly coupled to the inert gas source 110 (shown in FIG. 1) and configured to provide the shutoff trigger 156 flow of the inert gas 20 is less than the shutoff trigger 156. Advantageously, in such examples the flow switch 142 enhances safety of the semiconductor processing system 100 by closing the shutoff valve 146 in the unlikely event that the flow rate of the inert gas 20 is less than that required to inert the flow of residual process gas and/or process gas products 16 issued by the process chamber 102. As will be appreciated by those of skill in the art in view of the present disclosure, this reduces (or eliminates) the possibility of continuing to flow the process gas 14 to the process chamber 102 in the unlikely event that flow of the inert gas 20 to the vacuum source 112 is interrupted.

In accordance with certain examples, the gas system 104 may include a relay 160. In such examples the relay 160 may operably connect the flow switch 142 to the shutoff valve 146. The relay 160 may be configured to close the shutoff valve 146 when the flow switch 142 provides the shutoff signal 158. The relay 160 may be arranged, e.g., co-located, within the interior of the enclosure 144. The relay 160 may be arranged outside of the enclosure 144. It is also contemplated that the relay 160 may be arranged within the housing 154. Advantageously, employment of the relay 160 allows for closure of the shutoff valve 146 in response to any one of a plurality of flow switches monitoring gas flows in examples of the gas system 104 employing two or more flow switches. For example, the flow switch 142 may be arranged to provide a 24 volt DC output that the drops to 0 volts based on the comparison of the flow rate of gas traversing the flow switch 142 to the shutoff trigger 156, the relay 160 closing the shutoff valve 146 when one (or more) of the 24 volt DC output applied to relay 160 drop to 0 volts. Examples of suitable relays include G9SA safety relay units, available from the Omron Corporation of Kyoto, Japan.

It is also contemplated that, in accordance with certain examples, the gas system 104 may include a controller 162. The controller 162 may operably connect the flow switch 142 to the shutoff valve 146 and be configured to close the shutoff valve 146 when the flow switch 142 provides the shutoff signal 158. In certain examples, the controller 162 may be arranged within the interior of the enclosure 144. In accordance with certain examples, the controller 162 may be arranged outside of the enclosure 144. It is also contemplated that, in accordance with certain examples, the controller 162 may be arranged within the housing 154. Advantageously, employment of the controller 162 allows the gas system 104 to provide additional functionality in association with closure of the shutoff valve 146, such as operator alerts and/or logging, such as the monitoring of flow switch output voltages by way of non-limiting example. Examples of suitable controllers include EK1960 Twinsafe safety controllers, available from the Beckhoff Automation Company of Verl, Germany.

Figure 3:
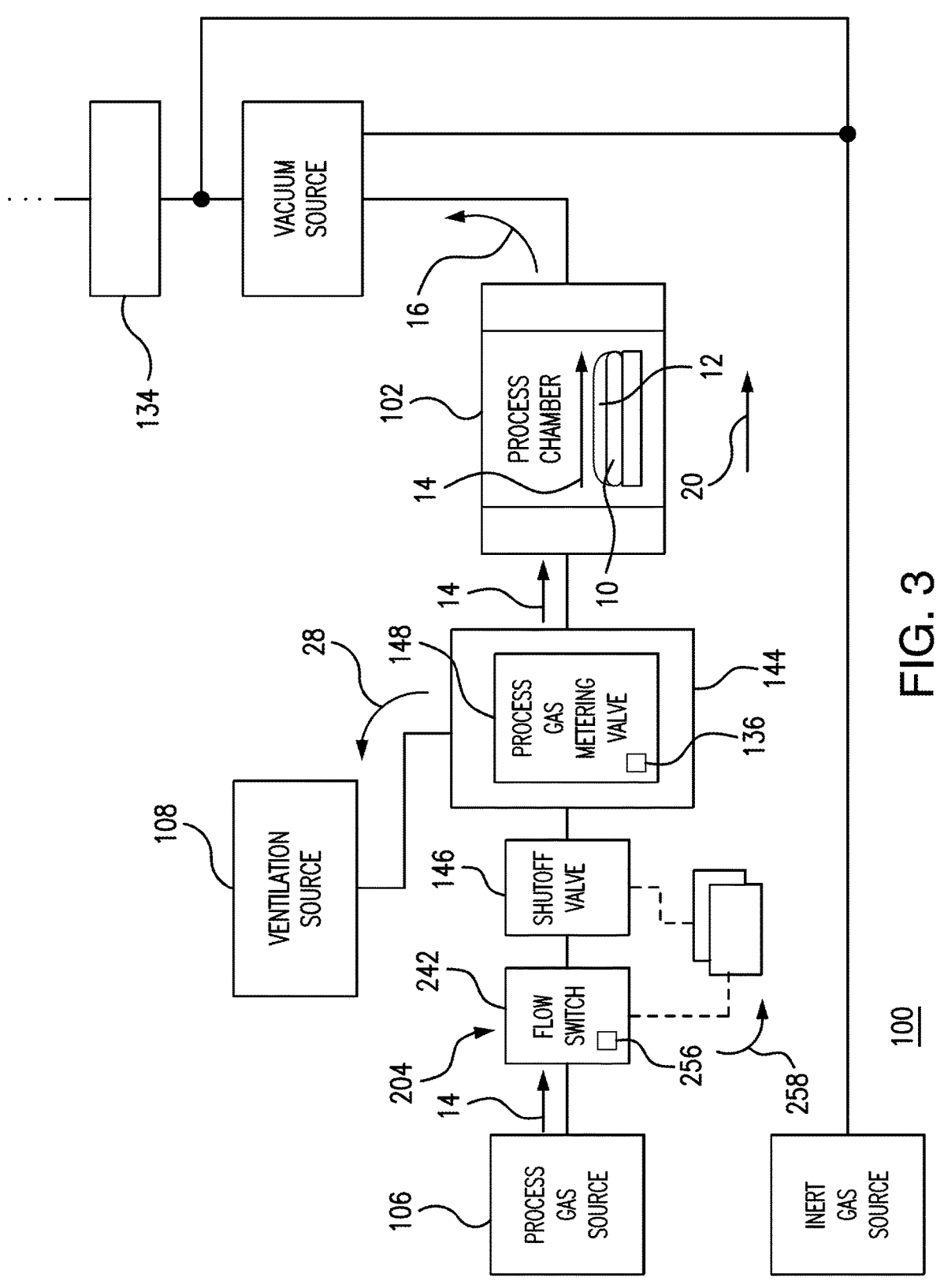
FIG. 3 is a schematic view of the semiconductor processing system of FIG. 1 according to an example, showing the gas system fluidly coupling the process gas source to the process chamber through a process gas flow switch.

With reference to FIG. 3, the semiconductor processing system 100 is shown according to an example including a gas system 204. The gas system 204 is similar to the gas system 104 (shown in FIG. 1) and additionally includes a process gas flow switch 242. The process gas flow switch 242 has a process gas shutoff trigger 256, is connected to the process gas source 106, and fluidly couples the process gas source 106 to the shutoff valve 146. It is contemplated that the process gas flow switch 242 be configured to provide a process gas shutoff signal 258 when the flow rate of the process gas 14 through the process gas flow switch 242 is greater than the process gas shutoff trigger 256, e.g., when the flow rate of the process gas 14 rises above the process gas shutoff trigger 256, the process gas shutoff signal 258 prompting closure of the shutoff valve 146 at process gas flow rates greater than the process gas shutoff trigger 256.

During deposition of the film 12 onto the substrate 10, the process gas source 106 provides the process gas 14 to the process gas flow switch 242, the ventilation source 108 ventilates the interior of the enclosure 144 with the vent gas 28, and the inert gas source 110 provides the inert gas 20 to the vacuum source 112. As the process gas 14 traverses the process gas flow switch 242, the process gas flow switch 242 compares the flow rate of the process gas 14 to the process gas shutoff trigger 256. When the flow rate of the process gas 14 is less than the process gas shutoff trigger 256, the shutoff valve 146 remains open, and the process gas 14 flows through the shutoff valve 146 and the process gas metering valve 138 to the process chamber 102. When the flow rate of the process gas 14 is greater than the process gas shutoff trigger 256, the process gas flow switch 242 provides the process gas shutoff signal 258. The process gas shutoff signal 258, when present, causes the shutoff valve 146 to close. Closure of the shutoff valve 146 in turn causes flow of the process gas 14 to the process chamber 102 to cease, issue of the residual process gas and/or process gas products 16 from the process chamber 102 ceasing. As will be appreciated by those of skill in the art in view of the present disclosure, this may limit the flow rate of the residual process gas and/or process gas products 16 to the vacuum pump according to the differences between the process gas shutoff trigger 256 of the process gas flow switch 242 and the flow rating 136 of the process gas metering valve 138.

Advantageously, the process gas flow switch 242 may reduce the flow rate of the inert gas 20 required by the process chamber 102 commensurate with the difference between process gas shutoff trigger 256 and the flow rating 136 of the process gas metering valve 138. In certain examples, the process gas shutoff trigger 256 may be smaller than the flow rating 136 of the process gas metering valve 138. For example, the process gas shutoff trigger 256 may be between about 10% and about 90% of the flow rating 136, or between about 30% and about 80% of the flow rating 136, or between about 50% and about 70% of the flow rating 136. Sizing the process gas shutoff trigger 256 of the process gas flow switch 242 to be smaller than the flow rating 136 of the process gas metering valve 138 allows the flow rate of the inert gas 20 required by the process chamber 102 to be smaller than the flow rating 136 of the process gas metering valve 138 due to cooperation of the process gas flow switch 242 and the process gas shutoff trigger 256, limiting inert gas consumption, and reducing operating costs of the semiconductor processing system 100. Cooperation of the process gas flow switch 242 and the shutoff valve 146 may also enhance the safety of the semiconductor processing system 100, for example, by preventing the process gas 14 from flowing to the process chamber 102 at flow rates in excess of that required to deposit the film 12 onto the substrate 10, such as in the event that an process recipe drives the process gas metering valve 138 to s fully open position. And cooperation of the process gas flow switch 242 and the shutoff valve 146 may also limit the flow rate of the vent gas 28 required to ventilate the enclosure 144 and/or capacity of the abatement device 134.

Figure 4:
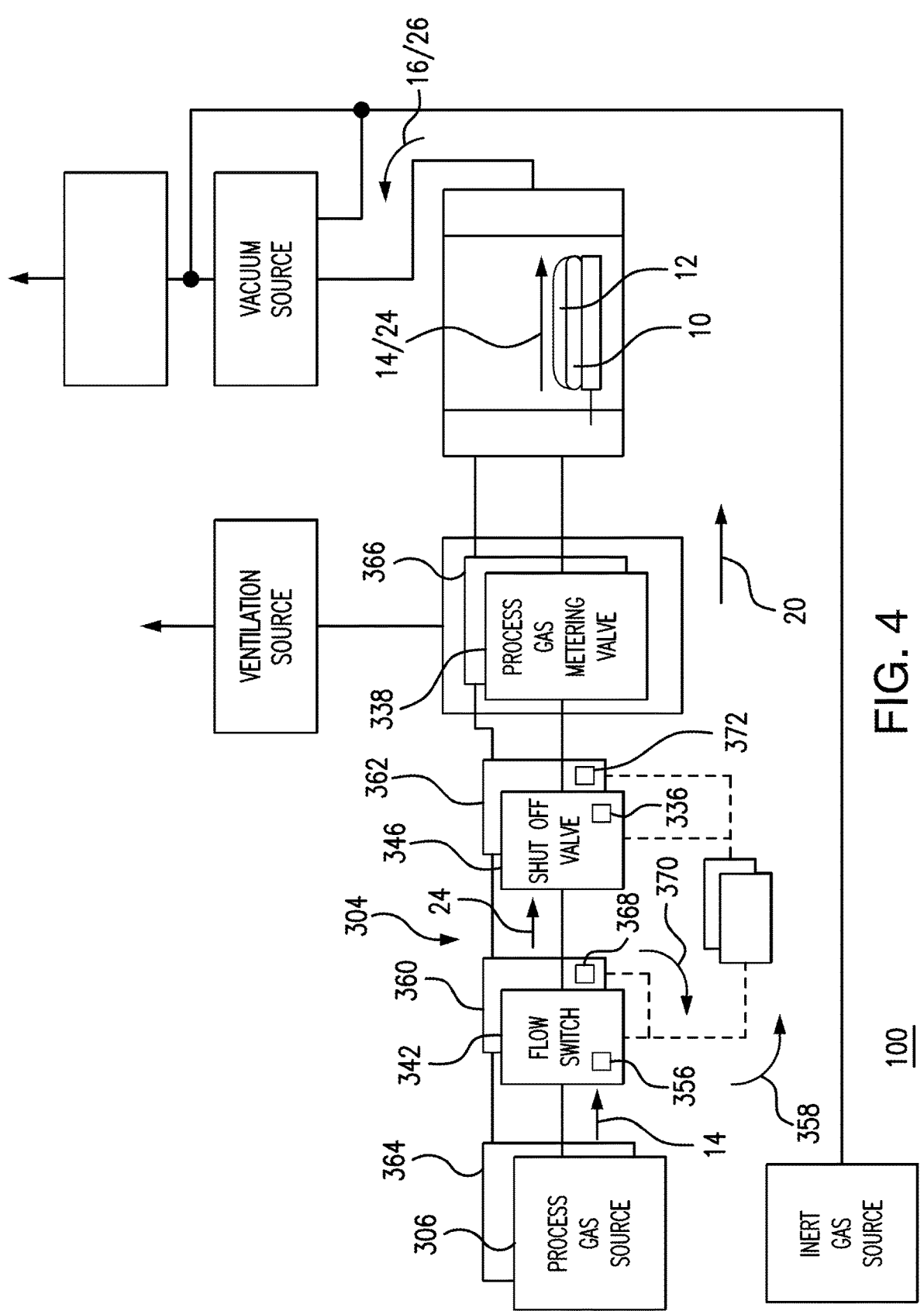
FIG. 4 is a schematic view of the semiconductor processing system of FIG. 1 according to another example, showing the gas system fluidly coupling first and second process gas sources to the process chamber through first and second process gas flow switches.

With reference to FIG. 4, the semiconductor processing system 100 is shown according to an example including a gas system 304. The gas system 304 is similar to the gas system 104 (shown in FIG. 1) and additionally includes a first process gas flow switch 342, a second process gas flow switch 360, a first shutoff valve 346, and a second shutoff valve 362. The first process gas flow switch 342 and the first shutoff valve 346 fluidly couple a first process gas source 306 to the process chamber 102 through a first process gas metering valve 338. The second process gas flow switch 360 and the second shutoff valve 362 fluidly couple a second process gas source 364 to the process chamber 102 through a second process gas metering valve 366.

It is contemplated that the first process gas flow switch 342 have a first process gas shutoff trigger 356. It is also contemplated that the first process gas flow switch 342 be configured to provide a first process gas shutoff signal 358 when the flow rate of a first process gas 14 traversing the first process gas flow switch 342 is greater than the first process gas shutoff trigger 356. It is further contemplated that the second process gas flow switch 360 have a second process gas shutoff trigger 368 and be configured to provide a second process gas shutoff signal 370 when the flow rate of a second process gas 24 is greater than the second process gas shutoff trigger 368. Although two process gas sources and associated flow switches are shown in the illustrated example, it is to be understood and appreciated that examples of the gas system 304 may have more than two process gas flow switches and associated shutoff valves and remain within the scope of the present disclosure.

During deposition of the film 12 onto the substrate 10, the first process gas source 306 provides the first process gas 14 to the first process gas flow switch 342 and the second process gas source 364 provides the second process gas 24 to the second process gas flow switch 360. As the first process gas 14 traverses the first process gas flow switch 342, the first process gas flow switch 342 compares the flow rate of the first process gas 14 to the first process gas shutoff trigger 356. When flow rate of the first process gas 14 is less than the first process gas shutoff trigger 356, the first shutoff valve 346 may remain open, and the first process gas 14 flows through the first shutoff valve 346 and the first process gas metering valve 338 to the process chamber 102. Similarly, as the second process gas traverses the second process gas flow switch 360, the second process gas flow switch 360 compares the flow rate of the second process gas 24 to the second process gas shutoff trigger 368, and the second shutoff valve 362 may remain open when flow rate of the second process gas 24 is less than the second process gas shutoff trigger 368.

When the flow rate of the first process gas 14 is greater than the first process gas shutoff trigger 356, the first process gas flow switch 342 provides the first process gas shutoff signal 358. The first process gas shutoff signal 358, when present, causes at least the first shutoff valve 346 to close. Closure of the first shutoff valve 346 in turn causes flow of the first process gas 14 to the process chamber 102 to cease, issue of the residual process gas and/or process gas products 16 from the process chamber 102 to the vacuum source 112 thereafter ceasing. In certain examples, the first process gas shutoff signal 358 may also cause the second shutoff valve 362 to close, issue of residual process gas and/or process gas products 16 associated with the second process gas 24 from the process chamber 102 also ceasing.

Similarly, when the flow rate of the second process gas 24 is greater than the second process gas shutoff trigger 368, the second process gas flow switch 360 provides the second process gas shutoff signal 370. The second process gas shutoff signal 370, when present, causes at least the second shutoff valve 362 to close. Closure of the second shutoff valve 362 in turn causes flow of the second process gas 24 to the process chamber 102 to cease, issue of the residual process gas and/or process gas products 16 associated with the second process gas 24 from the process chamber 102 thereafter ceasing. In certain examples, the second process gas shutoff signal 370 may also cause the second shutoff valve 362 to close, issue of residual process gas and/or process gas products 16 from the process chamber 102 also ceasing.

Advantageously, as above, the first process gas flow switch 342 and the second process gas flow switch 360 may reduce the flow rate of the inert gas 20 required by the process chamber 102. For example, the first process gas shutoff trigger 356 may be smaller than a first flow rating 336 of the first process gas metering valve 338 and the second process gas shutoff trigger 368 may be smaller than a second flow rating 372 of the second process gas metering valve 366. Such sizing allows the flow rate of the inert gas 20 required by the process chamber 102 to be smaller than otherwise required by the first flow rating 336 and the second flow rating 372 due to the above-described cooperation of the process gas flow switches and associated shutoff valves in the event that flow rate of either (or both) the first process gas 14 and/or the second process gas 24 exceeds the shutoff trigger of the flow switch traversed by each of the process gases. Cooperation of the process gas flow switches and shutoff valves may also enhance the safety of the semiconductor processing system 100, for example, by ceasing flow of both the first process gas 14 and the second process gas 24 to the process chamber 102 in the event that flow rate of either process gas exceeds the shutoff trigger of the respective flow switch.

Figure 5:
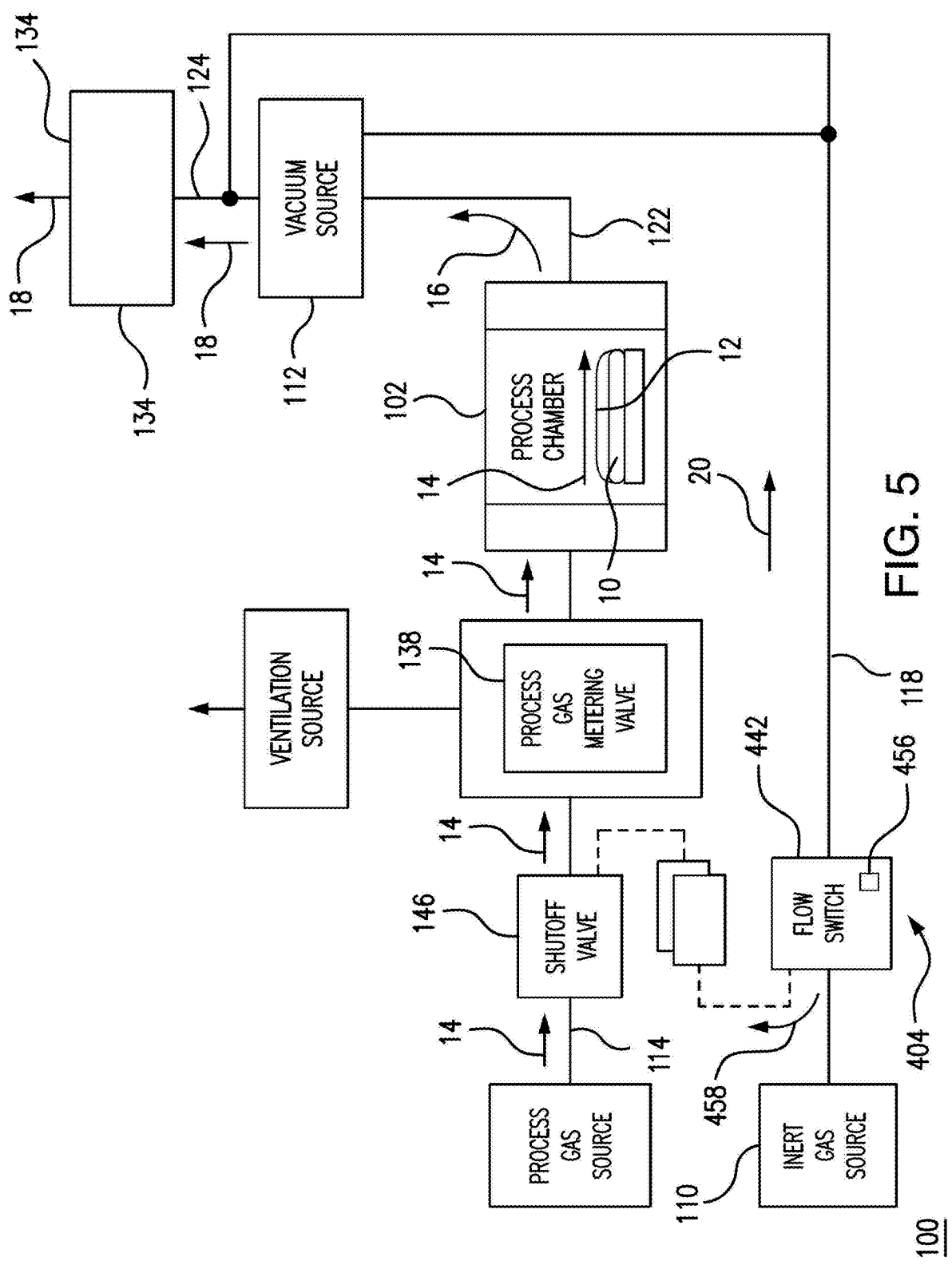
FIG. 5 is schematic view of the semiconductor processing system of FIG. 1 according to a further example, showing the gas system fluidly coupling the inert gas source to an exhaust source and an exhaust conduit through an inert gas flow switch.

With reference to FIG. 5, the semiconductor processing system 100 is shown according to an example including a gas system 404. The gas system 404 is similar to the gas system 104 (shown in FIG. 1) and additionally includes an inert gas flow switch 442. The inert gas flow switch 442 is connected to the inert gas source 110, fluidly couples the inert gas source 110 to the vacuum source 112, and is configured to control flow of the process gas 14 to the process chamber 102 according to the flow rate of the inert gas 20 traversing the inert gas flow switch 442. In this respect the inert gas flow switch 442 has an inert gas shutoff trigger 456 and is configured to provide an inert gas shutoff signal 458 when the flow rate of the inert gas 20 traversing the inert gas flow switch 442 is less than the inert gas shutoff trigger 456, e.g., when the flow rate of the inert gas 20 drops below the inert gas shutoff trigger 456, prompting closure of the shutoff valve 146. It is contemplated that inert gas shutoff trigger 456 be selected such that the inert gas flow switch 442 closes the shutoff valve 146 when the flow rate of the inert gas 20 is insufficient to render inert the residual process gas and/or process gas products 16 issued by the process chamber 102 during deposition of the film 12 onto the substrate 10.

During deposition of the film 12 onto the substrate 10, the inert gas source 110 provides the inert gas 20 to the vacuum source 112 and the process gas source 106 provides the process gas 14 to the process chamber 102 through the shutoff valve 146 and the process gas metering valve 138. The process chamber 102 in turn flows the process gas 14 across the substrate 10 to deposit the film 12 onto the substrate 10, and thereafter issues the residual process gas and/or process gas products 16 to the foreline 122 and therethrough to the vacuum source 112. The vacuum source 112 introduces the inert gas 20 provided by the inert gas source 110 into the residual process gas and/or process gas products 16 to form the exhaust gas 18. As will be appreciated by those of skill in the art in view of the present disclosure, introduction of the inert gas 20 into the residual process gas and/or process gas products 16 limits (or eliminates) hazards otherwise associated with the residual process gas and/or process gas products 16. As will also be appreciated by those of skill in the art in view of the present disclosure, this renders the exhaust gas 18 safe for flowing to the abatement device 134 through the exhaust conduit 124.

As the inert gas 20 traverses the inert gas flow switch 442 the inert gas flow switch 442 compares flow rate of the inert gas 20 to the inert gas shutoff trigger 456. When the flow rate of the inert gas 20 is greater than the inert gas shutoff trigger 456 the inert gas flow switch 442 takes no action, the shutoff valve 146 remains open, and the process gas 14 flows through both the shutoff valve 146 and the process gas metering valve 138 to the process chamber 102. When the flow rate of the inert gas 20 is less than that the inert gas shutoff trigger 456, e.g., in the unlikely event that flow of the inert gas 20 is insufficient to render the residual process gas and/or process gas products 16 safe to flow to the abatement device 134, the inert gas flow switch 442 provides the inert gas shutoff signal 458. The inert gas shutoff signal 458, when present, causes the shutoff valve 146 to close. Closure of the shutoff valve 146 in turn ceases flow of the process gas 14 to the process chamber 102 and issue of the residual process gas and/or process gas products 16 from the process chamber 102. As will be appreciated by those of skill in the art in view of the present disclosure, this limits (or eliminates) hazards otherwise potentially associated with the residual process gas and/or process gas products 16 during flow through the vacuum source 112 and/or the abatement device 134. As will be appreciated by those of skill in the art in view of the present disclosure, cooperation of the inert gas flow switch 442 and the shutoff valve 146 may further enhance safety of the semiconductor processing system 100.

Figure 6:
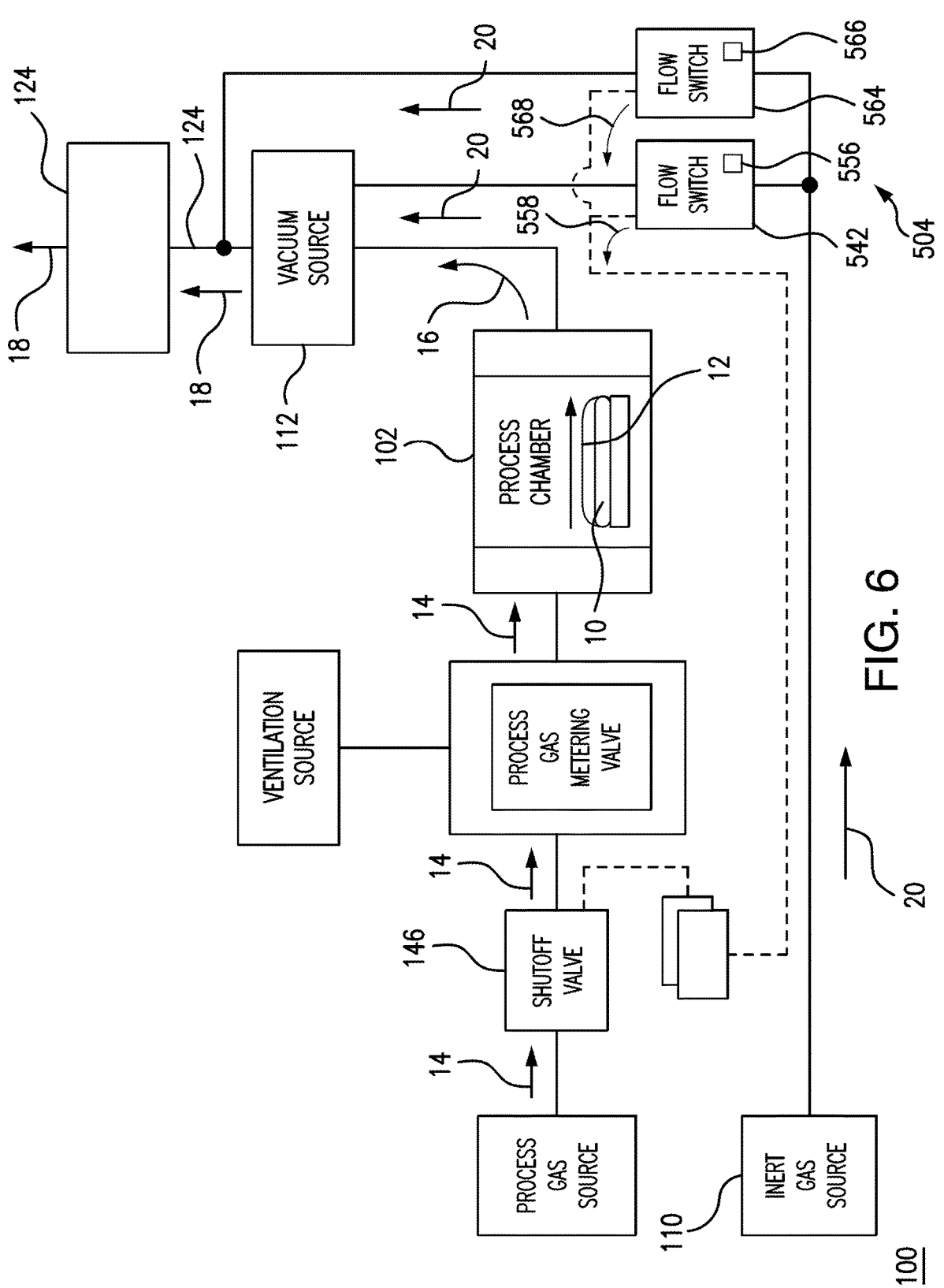
FIG. 6 is a schematic view of the semiconductor processing system of FIG. 1 according to another example, showing the gas system fluidly coupling the inert gas source to an exhaust source and an exhaust conduit through first and second inert gas flow switches.

With reference to FIG. 6, the semiconductor processing system 100 is shown according to an example including a gas system 504. The gas system 504 is similar to the gas system 104 (shown in FIG. 1) and additionally includes a first inert gas flow switch 542 and a second inert gas flow switch 564. The first inert gas flow switch 542 is connected to the inert gas source 110, fluidly couples the inert gas source 110 to the vacuum source 112, and is configured to control flow of the process gas 14 to the process chamber 102 according to the flow rate of a first portion of the inert gas 20 through the first inert gas flow switch 542 and to the vacuum source 112. The second inert gas flow switch 564 is also connected to the inert gas source 110, fluidly couples the inert gas source 110 to the exhaust conduit 124, and is configured to control flow of the process gas 14 to the process chamber 102 according to flow rate of a second portion of the inert gas 20 through the second inert gas flow switch 564 and to the exhaust conduit 124.

It is contemplated that the first inert gas flow switch 542 and the second inert gas flow switch 564 control flow of the process gas 14 to the process chamber 102 using a first inert gas shutoff trigger 556 and a second inert gas shutoff trigger 566. In this respect the first inert gas flow switch 542 compares flow rate of the first portion of the inert gas 20 to the vacuum source 112 with the first inert gas shutoff trigger 556, takes no action when the flow rate is greater than the first inert gas shutoff trigger 556, and provides a first inert gas shutoff signal 558 when the flow rate of the first portion of the inert gas 20 is less than the first inert gas shutoff trigger 556. In further respect, the second inert gas flow switch 564 similarly compares flow rate of the second portion of the inert gas 20 to the exhaust conduit 124 with the second inert gas shutoff trigger 566, takes no action when the flow rate is greater than the second inert gas shutoff trigger 566, and provides a second inert gas shutoff signal 568 when the flow rate of the second portion of the inert gas 20 is less than the second inert gas shutoff trigger 566. As will be appreciated by those of skill in the art in view of the present disclosure, provision of the first inert gas shutoff signal 558 and/or the second inert gas shutoff signal 568 causes the shutoff valve 146 to close. Closure of the shutoff valve 146 in turn ceases flow of the process gas 14 to the process chamber 102, issue of the residual process gas and/or process gas products 16 thereafter ceasing.

During deposition of the film 12 onto the substrate 10, the inert gas source 110 provides the first portion and the second portion of the inert gas 20 to the vacuum source 112 and the exhaust conduit 124, respectively, and the process gas source 106 provides the process gas 14 to the process chamber 102. The process chamber 102 flows the process gas 14 across the substrate 10 to deposit the film 12 onto the substrate 10, and thereafter issues the residual process gas and/or process gas products 16 to the foreline 122. The foreline 122 in turn flows the residual process gas and/or process gas products 16 to the vacuum source 112, which introduces the first portion of the inert gas 20 into the residual process gas and/or process gas products 16 to form the exhaust gas 18, which the vacuum source 112 provides to the exhaust conduit 124. The exhaust conduit 124 introduces the second portion of the inert gas 20 into the exhaust gas 18, e.g., at a union arranged along the exhaust conduit 124, and flows the further diluted exhaust gas 18 to the abatement device 134. As will be appreciated by those of skill in the art in view of the present disclosure, dividing the inert gas 20 into first and second portions limits sizing of the vacuum source 112 while limiting (or eliminating) hazards otherwise potentially associated with the residual process gas and/or process gas products 16.

As the first portion of the inert gas 20 traverses the first inert gas flow switch 542, the first inert gas flow switch 542 compares flow rate of the first portion of the inert gas 20 to the first inert gas shutoff trigger 556. At the same time, as the second portion of the inert gas 20 traverses the second inert gas flow switch 564, the second inert gas flow switch 564 compares flow rate of the second portion of the inert gas 20 to the second inert gas shutoff trigger 566. When the flow rates of both the first portion and the second portion of the inert gas 20 are greater than the first inert gas shutoff trigger 556 and the second inert gas shutoff trigger 566 no action is taken by either the first inert gas flow switch 542 and the second inert gas flow switch 564, the shutoff valve 146 remains open, and the process gas 14 flows through both the shutoff valve 146 and the process gas metering valve 138 to the process chamber 102. When the flow rate of the first portion and/or the second portion of the inert gas 20 are less than that the first inert gas shutoff trigger 556 and/or the second inert gas shutoff trigger 566, respectively, the first inert gas shutoff signal 558 and/or the second inert gas shutoff signal 568 are provided by the first inert gas flow switch 542 and/or the second inert gas flow switch 564. Either (or both) the first inert gas shutoff signal 558 and the second inert gas shutoff signal 568, when present, cause the shutoff valve 146 to close. Closure of the shutoff valve 146 in turn ceases flow of the process gas 14 to the process chamber 102, issue of the residual process gas and/or process gas products 16 from the process chamber 102 thereafter ceasing. As above, this limits (or eliminates) hazards otherwise potentially presented by the residual process gas and/or process gas products 16 during flow through the vacuum source 112 and/or the exhaust conduit 124, enhancing safety of the semiconductor processing system 100.

Figure 7:
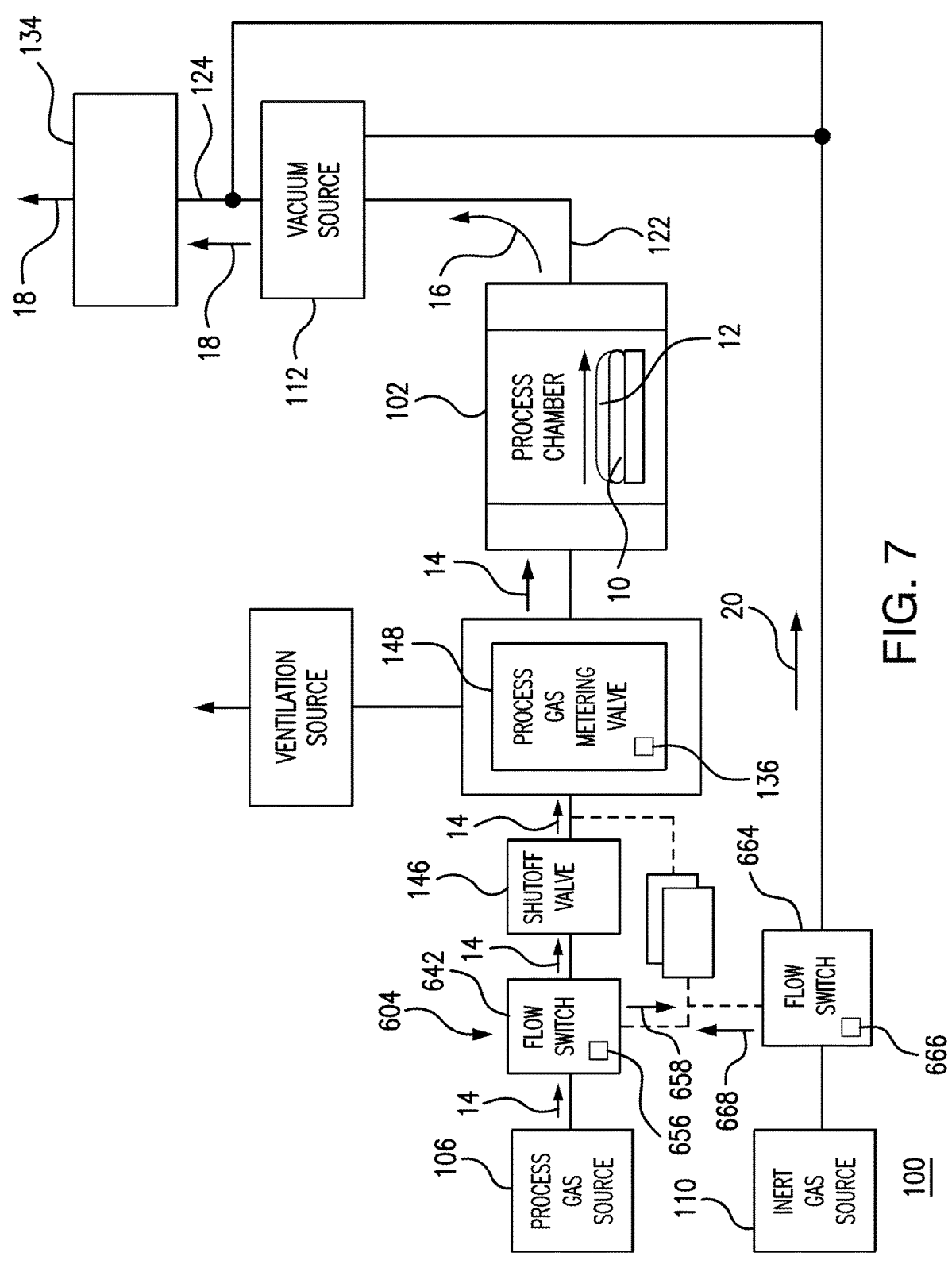
FIG. 7 is a schematic view of the gas system and the semiconductor processing system of FIG. 1 according to a further example, showing the gas system fluidly coupling the process gas source and the inert gas source to the process chamber through a process gas flow switch and an inert gas flow switch.

With reference to FIG. 7, the semiconductor processing system 100 is shown according to an example including a gas system 604. The gas system 604 is similar to the gas system 104 (shown in FIG. 1) and additionally includes a process gas flow switch 642 and an inert gas flow switch 664. The process gas flow switch 642 is connected to the process gas source 106, fluidly couples the inert gas source 110 to the process chamber 102 through the shutoff valve 146 and the process gas metering valve 138, and is configured to control flow of the process gas 14 to the process chamber 102 according to flow rate of the process gas 14 traversing the process gas flow switch 642. In this respect the process gas flow switch 642 has a process gas shutoff trigger 656 and is configured to provide a process gas shutoff signal 658 when the flow rate of the process gas 14 traversing the process gas flow switch 642 is greater than the process gas shutoff trigger 656. The process gas shutoff signal 658 (when present) causes the shutoff valve 146 to close, ceasing flow of the process gas 14 to the process chamber 102. When the flow rate of the process gas 14 traversing the process gas flow switch 642 does not exceed the process gas shutoff trigger 656 the process gas flow switch 642 does not provide the process gas shutoff signal 658, and the process gas 14 may flow to the process chamber 102.

The inert gas flow switch 664 is connected to the inert gas source 110, fluidly couples the inert gas source 110 to the vacuum source 112, and is configured to control flow of the process gas 14 to the process chamber 102 according to flow of the inert gas 20 traversing the inert gas flow switch 664. In this respect the inert gas flow switch 664 compares flow rate of the inert gas 20 to the inert gas shutoff trigger 666, takes no action when the flow rate of the inert gas 20 is greater than the inert gas shutoff trigger 666, and provides the inert gas shutoff signal 668 when the flow rate of the inert gas 20 is less than the inert gas shutoff trigger 666. The inert gas shutoff signal 668, when present, causes the shutoff valve 146 to close, ceasing flow of the process gas 14 to the process chamber 102. As will be appreciated by those of skill in the art in view of the present disclosure, ceasing flow of the process gas 14 to the process chamber 102 when the flow rate of the inert gas 20 is less than the inert gas shutoff trigger 666 limits (or eliminates) hazards that may otherwise be associated with the residual process gas and/or process gas products 16 in the unlikely event that the inert gas source 110 is unable to provide sufficient flow of the inert gas 20 the vacuum source 112 and/or the exhaust conduit 124.

During deposition of the film 12 onto the substrate 10, inert gas source 110 provides the inert gas 20 to the vacuum source 112 through the inert gas flow switch 664 and the process gas source 106 provides the process gas 14 to the process chamber 102 through the process gas flow switch 642 and the shutoff valve 146. The process chamber 102 in turn flows the process gas 14 across the substrate 10 to deposit the film 12 onto the substrate 10, and thereafter issues the residual process gas and/or process gas products 16 to the foreline 122. The foreline 122 flows the residual process gas and/or process gas products 16 to the vacuum source 112, which in turn introduces the inert gas 20 into the residual process gas and/or process gas product 16 to form the exhaust gas 18. As will be appreciated by those of skill in the art in view of the present disclosure, introduction of the inert gas 20 into the residual process gas and/or process gas products 16 limits (or eliminates) hazards otherwise associated with the residual process gas and/or process gas products 16 prior to flowing the exhaust gas 18 to the abatement device 134.

As the process gas 14 traverses the process gas flow switch 642 the process gas flow switch 642 compares flow rate of the process gas 14 to the process gas shutoff trigger 656. When the flow rate of the process gas 14 is greater than the process gas shutoff trigger 656 the process gas flow switch 642 provides the process gas shutoff signal 658, which (when present) closes the shutoff valve 146 and ceases flow of the process gas 14 to the process chamber 102. When the flow rate of the process gas 14 is less than the process gas shutoff trigger 656 the process gas flow switch 642 takes no action, and flow of the process gas 14 may continue through the shutoff valve 146 and the process gas metering valve 138 to the process chamber 102. It is contemplated that the process gas shutoff trigger 656 of the process gas flow switch 642 be smaller than the flow rating 136 of the process gas metering valve 138, limiting operating cost of the semiconductor processing system 100 by limiting the flow rate of the inert gas 20 required by the semiconductor processing system 100.

As the inert gas 20 traverses the inert gas flow switch 664, the inert gas flow switch 664 compares flow rate of the inert gas 20 to the inert gas shutoff trigger 666. When the flow rate of the inert gas 20 is greater than the inert gas shutoff trigger 666, the inert gas flow switch 664 takes no action, and flow of the process gas 14 through the shutoff valve 146 and the process gas metering valve 138 to the process chamber 102 may continue. When the flow rate of the inert gas 20 is less than the inert gas shutoff trigger 666, e.g., in the unlikely event of interruption of flow of the inert gas 20 from the inert gas source 110, the inert gas flow switch 664 provides the inert gas shutoff signal 668. The inert gas shutoff signal 668

(when present) causes the shutoff valve 146 to close, flow of the process gas 14 to the process chamber 102 thereafter ceasing. As above, closing the shutoff valve 146 prevents issue of the residual process gas and/or process gas products 16 to the foreline 122 and therethrough to the vacuum source 112 by ceasing flow of the process gas 14 to the process chamber 102 in the event that the flow rate of the inert gas 20 is insufficient to limit (or eliminate) hazards otherwise associated with the residual process gas and/or process gas products 16, enhancing safety of the semiconductor processing system 100. Notably, cooperation of the process gas flow switch 642 and the inert gas flow switch 664 with the shutoff valve 146 may limit operating cost by reducing inert gas required by the semiconductor processing system, limit the ventilation required by the semiconductor processing system 100, limit the flow rate of the exhaust gas 18 provided to the abatement device 134, and/or enhance safety of the semiconductor processing system 100.

With reference to FIG. 8, a gas flow control method 700 is shown. As shown with box 710, a gas, e.g., the process gas 14 (shown in FIG. 1) or the inert gas 20 (shown in FIG. 1), is provided to a flow switch, e.g., the flow switch 142 (shown in FIG. 2). As shown with box 720, the flow switch compares flow rate of the gas to a shutoff trigger of the flow switch, e.g., the shutoff trigger 156 (shown in FIG. 2). When the flow rate is within a predetermined range the process gas is flowed to a process chamber, e.g., the process chamber 102 (shown in FIG. 1), as shown with box 730, arrow 732, and box 740. A film is deposited onto a substrate supported within the process chamber using the process gas, e.g., the film 12 (shown in FIG. 1) onto the substrate 10 (shown in FIG. 1), as shown with box 750. Residual process gas and/or process gas products issued by the process chamber during the deposition of the film onto the substrate, e.g., the residual process gas and/or process gas products 16 (shown in FIG. 1), are thereafter mixed (inerted) with a flow of inert gas provided by an inert gas source, e.g., the inert gas 20 (shown in FIG. 1) provided by the inert gas source 110 (shown in FIG. 1), as shown with box 760. The flow rate of the process gas may be monitored iteratively (or continuously) during deposition of the film onto the substrate with the flow switch, as shown with arrow 762.

When the flow rate of the gas is not within the predetermined range flow of the process gas to the process chamber ceases, as shown with arrow 770 and box 772. In certain examples, a shutoff signal, e.g., the shutoff signal 158 (shown in FIG. 2), may be provided by the flow switch to cease flow of the process gas to the process chamber, as shown with box 774. In accordance with certain examples, deposition of the film the onto the substrate may cease when the flow rate of the process gas is outside of the predetermined range, as shown with box 780. It is also contemplated that deposition of the film onto the substrate may be accomplished by closure of shutoff valve operably associated with the flow switch, e.g., the shutoff valve 146 (shown in FIG. 2), as shown with box 782.

With reference to FIG. 9, a gas flow control method 800 is shown. As shown with box 810, a process gas, e.g., the process gas 14 (shown in FIG. 1), is provided to a process gas flow switch, e.g., the process gas flow switch 242 (shown in FIG. 3). As shown with box 820, the process gas flow switch compares flow rate of the process gas to a process gas shutoff trigger of the process gas flow switch, e.g., the process gas shutoff trigger 256 (shown in FIG. 3). When the flow rate of the process gas is less than the process gas shutoff trigger of the process gas flow switch, the process gas is flowed to a process chamber, e.g., the process chamber 102 (shown in FIG. 1), as shown with box 830, arrow 832, and box 840. The process chamber flows the process gas across a substrate supported within the process chamber such that a film is deposited onto a substrate, e.g., the film 12 (shown in FIG. 1) deposited onto the substrate 10 (shown in FIG. 1), as shown with box 850. Residual process gas and/or process gas products, e.g., the residual process gas and/or process gas products 16 (shown in FIG. 1), are thereafter intermixed (e.g., inerted) with a flow of inert gas provided by an inert gas source, e.g., the inert gas 20 (shown in FIG. 1) provided by the inert gas source 110 (shown in FIG. 1), as shown with box 860. The flow rate of the process gas to the process chamber may be monitored iteratively (or continuously) during deposition of the film onto the substrate using the process gas flow switch, as shown with arrow 862.

When the flow rate of the process gas is greater than the process gas shutoff trigger flow of the process gas to the process chamber ceases, as shown with arrow 870 and box 880. In certain examples, a process gas shutoff signal, e.g., the process gas shutoff signal 258 (shown in FIG. 3), may be provided by the process gas flow switch to cease flow of the process gas to the process chamber. In accordance with certain examples, deposition of the film the onto the substrate may cease when the flow rate of the process gas traversing the process gas flow switch is greater than (e.g., rises above) the process gas shutoff trigger, as shown with box 890. It is also contemplated that, in accordance with certain examples, deposition of the film onto the substrate may be accomplished by closure of shutoff valve operably associated with the process gas flow switch, e.g., the shutoff valve 146 (shown in FIG. 3).

With reference to FIG. 10, a gas flow control method 900 is shown. As shown with box 910, an inert gas, e.g., the inert gas 20 (shown in FIG. 1), is provided to an inert gas flow switch, e.g., the inert gas flow switch 442 (shown in FIG. 5). As shown with box 920, the inert gas flow switch compares flow rate of the inert gas traversing the inert gas flow switch to an inert gas shutoff trigger of the inert gas flow switch, e.g., the inert gas shutoff trigger 456 (shown in FIG. 5). When the flow rate of the inert gas is greater than the inert gas shutoff trigger, a process gas is flowed to a process chamber, e.g., the process gas 14 (shown in FIG. 1) to the process chamber 102 (shown in FIG. 1), as shown with box 930, arrow 932, and box 940. A film is deposited onto a substrate supported within the process chamber using the process gas, e.g., the film 12 (shown in FIG. 1) deposited onto the substrate 10 (shown in FIG. 1), as shown with box 950. Residual process gas and/or process gas products issued by the process chamber during deposition of the film onto the substrate, e.g., the residual process gas and/or process gas products 16 (shown in FIG. 1), are thereafter mixed (inerted) with the inert gas, as shown with box 960. The flow rate of the inert gas may be monitored iteratively (or continuously) as the process gas is flowed to the process chamber and the film deposited onto the substrate using the process gas flow switch, as shown with arrow 962.

When the flow rate of the inert gas is less than the inert gas shutoff trigger, flow of the process gas to the process chamber ceases, as shown with arrow 970 and box 980. In certain examples, a shutoff signal, e.g., the inert gas shutoff signal 458 (shown in FIG. 5), may be provided by the inert gas flow switch to cease flow of the process gas to the process chamber. In accordance with certain examples, deposition of the film the onto the substrate may cease when the flow rate of the inert gas is less than (e.g., falls below) the inert gas shutoff trigger, as shown with box 990. It is also contemplated that deposition of the film onto the substrate may be accomplished by closure of shutoff valve operably associated with the inert gas flow switch, e.g., the shutoff valve 146 (shown in FIG. 5).

With reference to FIG. 11, a gas flow control method 1000 is shown. As shown with box 1010 and box 1020, an inert gas is provided to an inert gas flow switch, e.g., the inert gas 20 (shown in FIG. 1) provided to the inert gas flow switch 664 (shown in FIG. 7), and a process gas provided to the process gas flow switch, e.g., the process gas 14 (shown in FIG. 1) provided to the process gas flow switch 642 (shown in FIG. 7). As shown with box 1030, a flow rate of the process gas is compared to a process gas shutoff trigger of the process gas flow switch, e.g., the process gas shutoff trigger 656 (shown in FIG. 7).

When the flow rate of the process gas is less than the process gas shutoff trigger, flow rate of the inert gas is compared to the an inert gas shutoff trigger of the inert gas flow switch, e.g., the inert gas shutoff trigger 666 (shown in FIG. 7), as shown with box 1040, arrow 1042, and box 1050. When the flow rate of the inert gas is greater than the inert gas shutoff trigger the process gas is flowed to a process chamber, e.g., the process chamber 102 (shown in FIG. 1), and a film deposited onto a substrate, e.g., the film 12 (shown in FIG. 1) deposited onto the substrate 10 (shown in FIG. 1), as shown with box 1060, arrow 1062, and box 1070. Residual process gas and/or process gas products may be inerted with the by introducing the inert gas into residual process gas and/or process gas products issued by the process chamber, as shown with box 1072. The flow rate of the process gas and inert gas may be iteratively (or continuously) monitored during deposition of the film onto the substrate, as shown with arrow 1074.

When the flow rate of the process gas is greater than the process gas shutoff trigger and/or the flow rate of the inert gas is less than the inert gas shutoff trigger, flow of the process gas to the process chamber ceases, as shown with arrow 1080, arrow 1082, box 1084, and box 1086. It is contemplated that ceasing the flow of process gas to the process chamber may cease deposition of the film onto the substrate, e.g., prior to completion of deposition of the film onto the substrate, as shown with box 1090.

Figure 12:
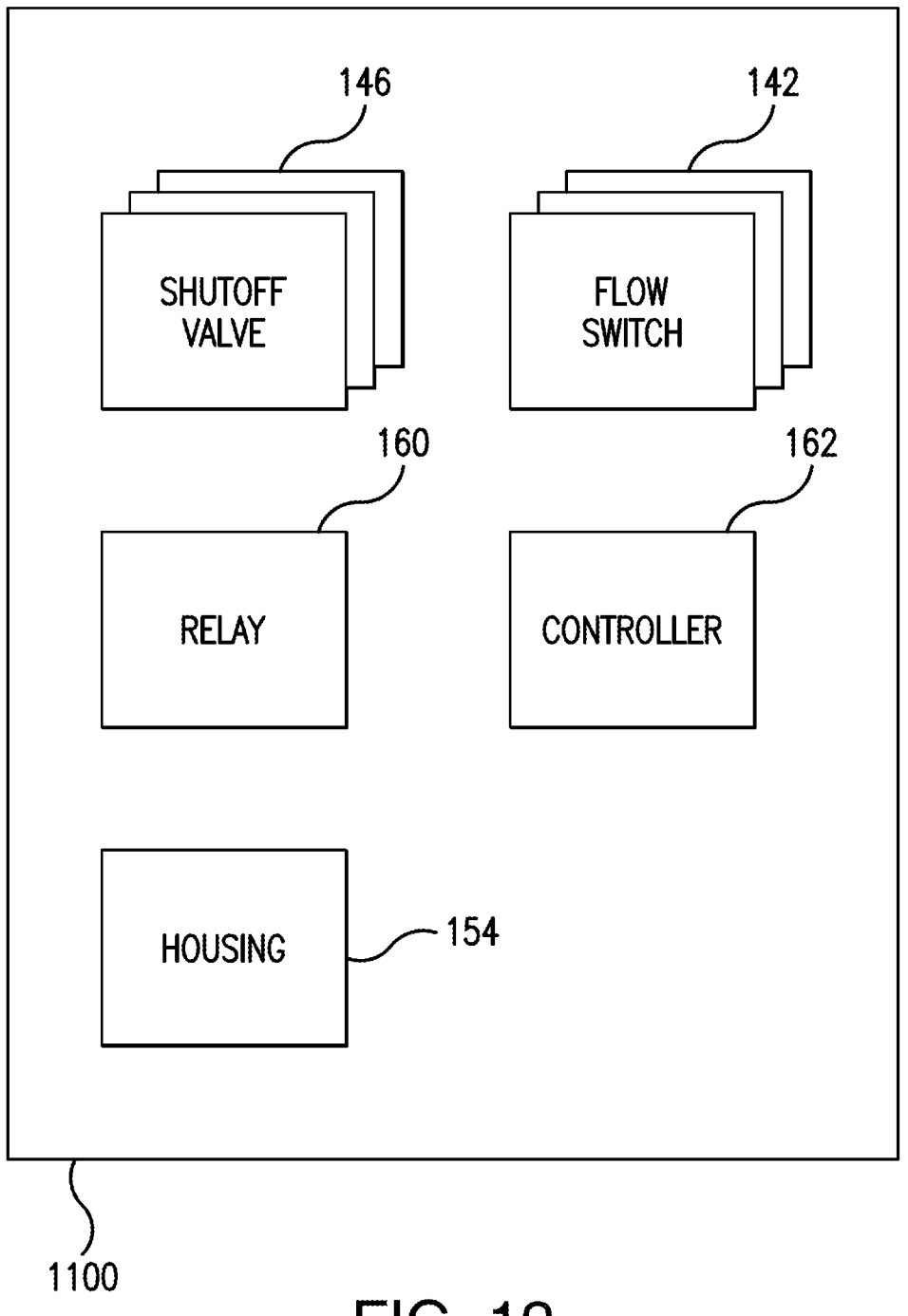
FIG. 12 is a schematic diagram of gas control kit for a semiconductor processing system in accordance with the present disclosure, showing elements of the kit.

With reference to FIG. 12, a kit 1100 for a gas flow control system gas system is shown. The kit 1100 includes a shutoff valve configured to control flow of a process gas to a process chamber, e.g., the shutoff valve 146 (shown in FIG. 2), and a flow switch configured for operative connection to the shutoff valve to close the shutoff valve according to flow of a gas traversing the flow switch, e.g., the flow switch 142 (shown in FIG. 2). In certain examples, the kit 1100 may include a housing configured to house the shutoff valve and the flow switch outside of an enclosure, e.g., the housing 154 (shown in FIG. 2). In accordance with certain examples, the kit 1100 may include a relay and/or a controller configured to connect the flow switch to the shutoff valve, e.g., the relay 160 (shown in FIG. 2) and/or the controller 162 (shown in FIG. 2). It is also contemplated that the flow switch may be one of a plurality of flow switches configured to control flow of the process gas through the shutoff valve according to a process gas or an inert gas traversing the flow switch.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

PARTS LIST

10 Substrate
12 Film
14 Process Gas
16 Residual Process Gas and/or Process Gas Products
18 Exhaust Gas
20 Inert Gas
22 External Environment
24 Second Process Gas
28 Vent Gas
100 Semiconductor Processing System
102 Process Chamber
104 Gas System
106 Process Gas Source
108 Ventilation Source
110 Inert Gas Source
112 Vacuum Source
114 Process Gas Source Conduit
116 Process Gas Supply Conduit
118 Inert Gas Conduit
120 Ventilation Conduit
122 Foreline
124 Exhaust Conduit
126 Substrate Support
128 Exhaust Flange
130 Exhaust Flange
132 Blower or Fan
134 Abatement Device
136 Flow Rating
138 Process Gas Metering Valve
140 Aperture Plate
142 Flow Switch
144 Enclosure
146 Shutoff Valve
148 MFC
150 MFM
152 Servo-Controlled Valve
154 Housing
156 Shutoff Trigger
158 Shutoff Signal
160 Relay
162 Controller
204 Gas System
242 Process Gas Flow Switch
256 Process Gas Shutoff Trigger
258 Process Gas Shutoff Signal
304 Gas System
306 First Process Gas Source
338 First Process Gas Metering Valve
342 First Process Gas Flow Switch 346 First Shutoff Valve
356 First Process Gas Shutoff Trigger
358 First Process Gas Shutoff Signal
360 Second Process Gas Flow Switch
362 Second Shutoff Valve
364 Second Process Gas Source
366 Second Process Gas Metering Valve
368 Second Process Gas Shutoff Trigger
370 Second Process Gas Shutoff Signal
404 Gas System
442 Inert Gas Flow Switch
456 Inert Gas Shutoff Trigger
458 Inert Gas Shutoff Signal
504 Gas System
542 First Inert Gas Flow Switch
556 First Inert Gas Shutoff Trigger
558 First Inert Gas Shutoff Signal
564 Second Inert Gas Flow Switch
566 Second Inert Gas Shutoff Trigger
568 Second Inert Gas Shutoff Signal
604 Gas System
642 Process Gas Flow Switch
656 Process Gas Shutoff Trigger
658 Process Gas Shutoff Signal
664 Inert Gas Flow Switch
666 Inert Gas Shutoff Trigger
668 Inert Gas Shutoff Signal
700 Gas Flow Control Method
710 Box
720 Box
730 Box
732 Arrow
740 Box
750 Box
760 Box
770 Arrow
772 Box
774 Box
780 Box
782 Box
800 Gas Flow Control Method
810 Box
820 Box
830 Box
832 Arrow
840 Box
850 Box
860 Box
862 Arrow
870 Arrow
880 Box

The invention claimed is:

1. A gas system, comprising: an enclosure; a process gas source fluidly coupled to a process gas conduit; an inert gas source fluidly coupled to an inert gas conduit wherein the process gas conduit and the inert gas conduit do not intersect; a process gas metering valve arranged within the enclosure and configured to flow a process gas from the process gas source to a process chamber of a semiconductor processing system; a shutoff valve connected to the process gas metering valve and configured to fluidly separate the process gas metering valve from the process gas source; and a flow switch operably connected to the shutoff valve and configured to provide a shutoff signal according to a flow of an inert gas from the inert gas source traversing the flow switch, wherein the shutoff valve is configured to cease the flow of the process gas to the process chamber of the semiconductor processing system in response to the shutoff signal, wherein the flow switch has a shutoff trigger, wherein the process gas metering valve has a flow rating, and wherein the shutoff trigger of the flow switch is less than the flow rating of the process gas metering valve.

2. The gas system of claim 1, wherein at least one of the shutoff valve and the flow switch are arranged outside of the enclosure.

3. The gas system of claim 1, wherein the flow switch is fluidly isolated from the shutoff valve.

4. The gas system of claim 1, further comprising a relay connecting the flow switch to the shutoff valve.

5. The gas system of claim 1, further comprising a controller connecting the flow switch to the shutoff valve.

6. The gas system of claim 1, wherein the process gas source is a first process gas source, the flow switch is a first process gas flow switch, and the shutoff valve is a first shutoff valve, the gas system further comprising: a second process gas source; a second process gas flow switch connected to the second process gas source; and a second shutoff valve connected to the second process gas flow switch and fluidly coupling the second process gas source to the process chamber, wherein the second process gas flow switch is operably connected to the second shutoff valve.

7. The gas system of claim 1, further comprising: a foreline connected to the process chamber; a vacuum pump connected to the foreline; an inert gas flow switch connected to the vacuum pump; and the inert gas source connected to the inert gas flow switch and fluidly coupled therethrough to the vacuum pump, wherein the inert gas flow switch is operably connected to the shutoff valve.

8. The gas system of claim 1, wherein the flow switch is an inert gas flow switch, the gas system further comprising:
a vacuum pump connected to the process chamber; and
the inert gas source connected to the inert gas flow switch and fluidly coupled therethrough to the vacuum pump while bypassing the process chamber.

9. The gas system of claim 8, wherein the inert gas flow switch has an inert gas shutoff trigger, and wherein the inert gas flow switch is configured to close the shutoff valve when the flow of the inert gas from the inert gas source to the vacuum pump is less than the inert gas shutoff trigger.

10. The gas system of claim 1, further comprising:
a foreline fluidly coupled to the process gas metering valve;

a vacuum pump connected to the foreline; and
an process gas flow switch fluidly coupled to the process gas conduit, wherein the process gas flow switch is operably connected to the shutoff valve.

11. The gas system of claim 10, wherein the process gas flow switch has a process gas shutoff trigger, and wherein the process gas flow switch is configured to close the shutoff valve when a flow of the process gas traversing the process gas flow switch is less than the process gas shutoff trigger.

12. The gas system of claim 10, wherein the flow switch is a first inert gas flow switch, the gas system further comprising:
an exhaust conduit connected to the vacuum pump; and
a second inert gas flow switch fluidly coupled to the exhaust conduit and therethrough to the vacuum pump, wherein the second inert gas flow switch is operably connected to the flow switch.

13. A semiconductor processing system, comprising:
a gas system as recited in claim 1, wherein the flow switch is an inert gas flow switch, wherein the shutoff trigger is an inert gas shutoff trigger
a substrate support arranged within the process chamber and configured to seat thereon a substrate during deposition of a film onto the substrate using the process gas provided by the process gas source.

14. The gas system of claim 1, further comprising a controller configured to:
operably connect the flow switch and the shutoff valve; and
in response to the shutoff signal, close the shutoff valve.

15. The gas system of claim 1, further comprising a relay configured to:
operably connect the flow switch and the shutoff valve; and
in response to the shutoff signal, close the shutoff valve.

16. The gas system of claim 1, wherein the shutoff valve is configured to receive the shutoff signal.

17. The gas system of claim 16, further comprising at least one of a controller or a relay, and wherein the at least one of a controller or a relay is configured to:
receive the shutoff signal from the flow switch; and
provide the shutoff signal to the shutoff valve.

* * * * *